(12) United States Patent
Yasar et al.

(10) Patent No.: US 11,222,464 B2
(45) Date of Patent: Jan. 11, 2022

(54) INTELLIGENT IMAGERY

(71) Applicant: The Travelers Indemnity Company, Hartford, CT (US)

(72) Inventors: Murat Yasar, West Hartford, CT (US); Kelly D. Fisher, Wethersfield, CT (US); Brototi Paul, Glastonbury, CT (US); Jerrod K. Bowman, West Hartford, CT (US); Cathy J. Miller, Windsor, CT (US); Sara M. Nunez, East Longmeadow, MA (US)

(73) Assignee: THE TRAVELERS INDEMNITY COMPANY, Hartford, CT (US)

( * ) Notice: Subject to any disclaimer, the term of this patent is extended or adjusted under 35 U.S.C. 154(b) by 0 days.

(21) Appl. No.: 16/547,813

(22) Filed: Aug. 22, 2019

(65) Prior Publication Data

US 2021/0056753 A1 Feb. 25, 2021

(51) Int. Cl.
*G06T 17/05* (2011.01)
*G06F 30/13* (2020.01)
*G06N 5/04* (2006.01)
*G06N 20/00* (2019.01)
*G06K 9/62* (2006.01)
*G06T 7/70* (2017.01)
*G06K 9/00* (2006.01)

(52) U.S. Cl.
CPC ............. *G06T 17/05* (2013.01); *G06F 30/13* (2020.01); *G06K 9/00637* (2013.01); *G06K 9/6215* (2013.01); *G06K 9/6256* (2013.01); *G06N 5/04* (2013.01); *G06N 20/00* (2019.01); *G06T 7/70* (2017.01); *G06T 2200/08* (2013.01); *G06T 2200/24* (2013.01); *G06T 2207/20081* (2013.01); *G06T 2207/30184* (2013.01)

(58) Field of Classification Search
CPC ....... G06T 17/05; G06T 7/70; G06T 2200/08; G06T 2200/24; G06T 2207/20081; G06T 2207/30184; G06N 20/00; G06N 5/04; G06F 30/13; G06K 9/00637; G06K 9/6215; G06K 9/6256
See application file for complete search history.

(56) References Cited

U.S. PATENT DOCUMENTS 4,852,313 A * 8/1989 Jones .................. E04H 1/00
 52/169.3
5,276,866 A 1/1994 Paolini
(Continued)

*Primary Examiner* — Sing-Wai Wu
(74) *Attorney, Agent, or Firm* — Cantor Colburn LLP

(57) ABSTRACT

A system includes a processing system and memory system configured to apply a building detection model to identify a footprint of a building based on a first dataset. The building characterization model is applied to identify one or more derived characteristics of the building based on the footprint. A building area is determined based on the footprint and at least one of the one or more derived characteristics of the building. A record is created including an indicator of a geographic area, the building area, and the one or more derived characteristics of the building. A processing request is generated based on the record. One or more derived characteristics of the building are compared with one or more corresponding values of property data from a third-party data source to identify a mismatch. A data accuracy verification request is output based on the mismatch.

26 Claims, 16 Drawing Sheets

(56) References Cited

U.S. PATENT DOCUMENTS

| | | | |
|---|---|---|---|
| 5,745,751 A * | 4/1998 | Nelson | G06T 11/206 |
| | | | 707/790 |
| 8,078,436 B2 | 12/2011 | Pershing et al. | |
| 8,145,578 B2 | 3/2012 | Pershing et al. | |
| 8,170,840 B2 | 5/2012 | Pershing | |
| 8,209,152 B2 | 6/2012 | Pershing | |
| 8,670,961 B2 | 3/2014 | Pershing et al. | |
| 8,731,234 B1 | 5/2014 | Ciarcia et al. | |
| 8,774,525 B2 | 7/2014 | Pershing | |
| 8,818,770 B2 | 8/2014 | Pershing | |
| 8,825,454 B2 | 9/2014 | Pershing | |
| 9,070,018 B1 | 6/2015 | Ciarcia et al. | |
| 9,129,376 B2 | 9/2015 | Pershing | |
| 9,135,737 B2 | 9/2015 | Pershing | |
| 9,141,880 B2 | 9/2015 | Ciarcia | |
| 9,147,287 B2 | 9/2015 | Ciarcia | |
| 9,152,863 B1 | 10/2015 | Grant | |
| 9,330,494 B2 | 5/2016 | Schultz | |
| 9,501,700 B2 | 11/2016 | Loveland et al. | |
| 9,514,568 B2 | 12/2016 | Pershing et al. | |
| 9,542,417 B2 | 1/2017 | Hieronymus et al. | |
| 9,599,466 B2 | 3/2017 | Pershing | |
| 9,679,227 B2 | 6/2017 | Taylor et al. | |
| 9,911,228 B2 | 3/2018 | Pershing et al. | |
| 9,933,257 B2 | 4/2018 | Pershing | |
| 9,953,370 B2 | 4/2018 | Pershing et al. | |
| 9,959,581 B2 | 5/2018 | Pershing | |
| 10,019,761 B2 | 7/2018 | Cuttell et al. | |
| 10,127,670 B2 | 11/2018 | Lewis et al. | |
| 2012/0209782 A1 | 8/2012 | Pershing et al. | |
| 2013/0226515 A1 | 8/2013 | Pershing et al. | |
| 2013/0311240 A1 | 11/2013 | Pershing et al. | |
| 2014/0278568 A1 | 9/2014 | Ekman | |
| 2014/0278809 A1 | 9/2014 | Ekman | |
| 2015/0135114 A1 * | 5/2015 | Zhang | G06F 16/9535 |
| | | | 715/771 |
| 2015/0370928 A1 | 12/2015 | Pershing | |
| 2015/0370929 A1 | 12/2015 | Pershing | |
| 2017/0083546 A1 | 3/2017 | Hieronymus et al. | |
| 2017/0154131 A1 | 6/2017 | Loveland et al. | |
| 2017/0242873 A1 | 8/2017 | Barrow et al. | |
| 2017/0277980 A1 | 9/2017 | Taylor et al. | |
| 2018/0190018 A1 | 7/2018 | Pershing et al. | |
| 2018/0247383 A1 | 8/2018 | Pershing | |
| 2019/0102897 A1 | 4/2019 | Lewis et al. | |
| 2019/0138665 A1 | 5/2019 | Pershing | |
| 2019/0138666 A1 | 5/2019 | Pershing | |
| 2019/0188337 A1 | 6/2019 | Keane | |
| 2019/0220711 A1 | 7/2019 | Taylor et al. | |

* cited by examiner

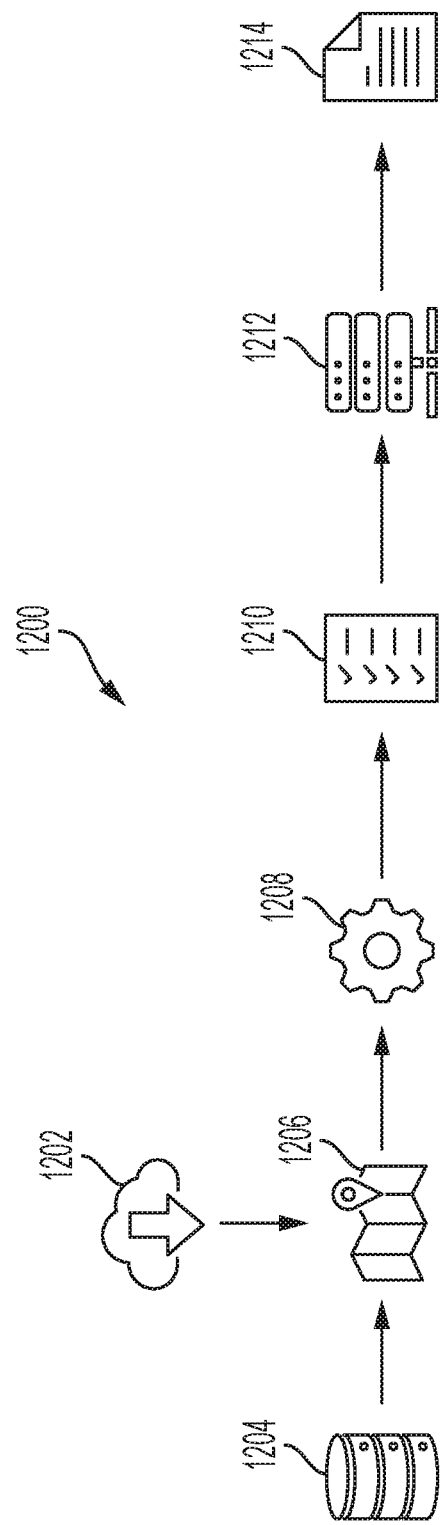

INTELLIGENT IMAGERY

BACKGROUND

Data collection related to physical properties typically requires a physical presence at locations of interest to investigate and confirm characteristics of the properties. Various databases that include property information may be accessible over a network for remote access. However, the information provided by the databases may be inaccurately captured or out of date. Regional views of aerial imagery may also be available to provide a high-level overhead view of properties. Regional views of aerial images may not have sufficient resolution to accurately discern fine details in images and may be infrequently refreshed such that recent changes to properties are not captured in the images. Ground-based image capturing systems can collect images available from the street. These images, however, provide a limited viewing perspective and also may be infrequently captured. Elements of a property that are located remotely from a road or are obstructed by trees, fences, or structures may not be readily observable from street view images.

BRIEF DESCRIPTION OF THE DRAWINGS

The subject matter which is regarded as the invention is particularly pointed out and distinctly claimed in the claims at the conclusion of the specification. The features and advantages of the invention are apparent from the following detailed description taken in conjunction with the accompanying drawings in which:

FIG. 12 depicts a process using intelligent imagery for rating and quoting according to some embodiments of the present invention;

DETAILED DESCRIPTION

Figure 1:
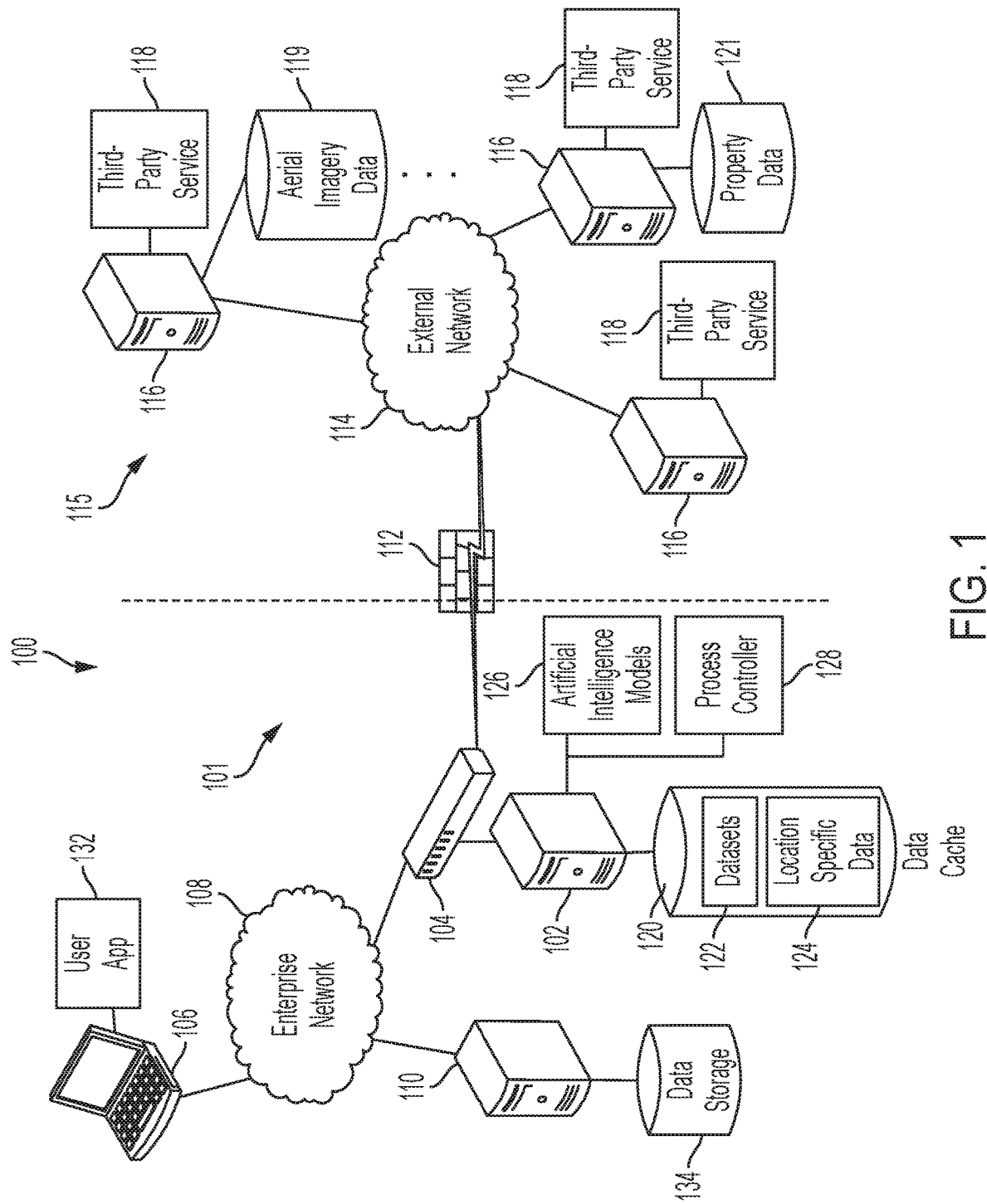
FIG. 1 depicts a block diagram of a system according to some embodiments of the present invention.

According to an embodiment, a system for intelligent imagery processing is provided. The system may be used for various practical applications of extracting information from image data in combination with one or more data sources. By using image data captured from multiple viewing perspectives and accessing one or more related data sources, many derived characteristics can be extracted without having to physically travel to a geographic area captured in the images. Some types of data can be discovered from a single viewing perspective, such as an overhead view from aerial imagery data, using artificial intelligence/machine learning to locate features of interest in a large volume of data. Other types of data can be discovered when multiple data sets are merged or accessed in parallel. For example, using data sets from multiple viewing perspectives can enable construction of partial three-dimensional models that can be further analyzed to discover features of interest using artificial intelligence/machine learning that would not be readily discernable from analyzing the datasets in isolation. A partial three-dimensional model can incorporate features or otherwise correlate features in three-dimensional space without creating a full rendering of objects in three-dimensional space. For instance, a planimetric image can be formed in one viewing perspective, and one or more other images having a different viewing perspective can be accessed to correlate data associated with a feature of interest from the planimetric image with the one or more other viewing perspectives to observe portions of the feature of interest in three-dimensional space. Some features of interest may be observed using only a single viewing perspective of a two-dimensional image. For example, a planimetric image can show a horizontal portion of features compiled into map features through a photogrammetric process with accurate horizontal distances between features such as paved surfaces, building footprints, water bodies, vegetation, and various manmade features.

Further, a group of machine learning models can be developed that look for specific features, groups of features, and various characteristics associated with properties viewed at a wider scale (e.g., a neighborhood) and a detailed lower-level scale, such as missing shingles on a specific roof. The use of supplemental property data can enhance the visual data, such as identifying features that are not directly visible in the image data (e.g., property boundaries). When third-party data sources also include data that may be viewable in the image data, the results of the machine learning model analysis may be compared to the data captured at the third-party data sources to determine an accuracy score of the third-party data sources. For instance, some third-party data sources may include data entry errors or may not be refreshed and updated at a sufficient interval to remain current.

In embodiments, various technology challenges may also be addressed to enhance machine learning speed and accuracy. As one example, where a group of multiple models for machine learning is applied to derive multiple characteristics associated with a property, rather than separately developing machine learning models for each feature of interest, transfer learning can be used such that new models only need partial training/retraining. As one example, a building roof condition model can be partially extracted to capture a core learning structure and weights/coefficients, with a new model top-level applied to form a building siding condition model. For instance, both models may internally look for shape patterns and inconsistencies in the shape patterns over large physical areas. This transfer learning process can more quickly and accurately train new models by reusing portions of learning from previously developed and verified models.

Further, network performance may be enhanced by locally caching portions of data sets and analysis previously performed. As learning is performed for a particular geographic area, records can be tagged with date/time stamps for comparison against source data in future iterations. For instance, if multiple users are accessing an analysis tool that performs machine learning for a particular geographic area, a copy of the analysis results can be stored within an enterprise storage system to prevent repetitive application of machine learning and data transfer requests across a network by using the stored copies of analysis results and/or datasets received from a third-party source. When a new request for analysis is made, the enterprise storage system can be checked first to see if a copy of the desired information is already locally available. Further, before requesting a new transfer of data from a remote data source, a date-time of last refresh can be checked at the remote data source to verify whether the desired data has been updated such that it no longer aligns with a copy previously acquired and stored within the enterprise storage system. If new data exists, then associated datasets can be transferred to the enterprise storage system to apply machine learning processes on the updated data.

Turning now to FIG. 1, a system 100 is depicted upon which intelligent imagery may be implemented. The system 100 can include an enterprise network zone 101 including a data processing server 102 coupled to a gateway 104 operable to establish communication with one or more user systems 106, one or more data storage servers 110, and/or other devices (not depicted) through an enterprise network 108. The gateway 104 may also establish communication to an external network 114, for instance, through a firewall 112, to send data to and receive data from a plurality of third-party servers 116 in an external network zone 115. The third-party servers 116 can each execute one or more third-party services 118. Examples of third-party services 118 can include, for instance, data collection, processing and analytics services that operate on large volumes of data and are implemented by third parties, such as vendors, advisors, brokers, and the like. For instance, third-party services 118 can provide aerial imagery data 119, property data 121, and other such data. In embodiments, the enterprise network zone 101 can include a plurality of networked resources that may be distributed over multiple locations, where the networked resources are access-controlled by an enterprise. The external network zone 115 may link to networked resources that are outside of enterprise control and may be distributed over a wide geographic area.

In the example of FIG. 1, the data processing server 102 is operatively coupled to a data cache 120 that provides short-term data buffering of datasets 122 and location specific data 124 extracted from the third-party services 118 and further processed using artificial intelligence (AI) models 126. A process controller 128 can execute on the data processing server 102 to manage data acquisition, use of AI models 126, storage to the data cache 120, and interfacing with other components of the system 100. The AI models 126 can be trained to detect features of interest in the datasets 122 and location specific data 124. Further, the AI models 126 can apply multiple levels of models to discover patterns between multiple datasets 122 and derived characteristics. The AI models 126 can be applied across various file types and data structures, such as images, text, and/or other data formats. The AI models 126 can apply machine learning algorithms to identify various features, such as buildings and other structures, along with characteristics of the buildings (e.g., footprint size, number of levels, roofing type, siding type, exterior condition, and other such characteristics). Features, such as property boundaries, can be extracted from the location specific data 124 to summarize features of specific properties and wider-scale AI models 126 can be applied to discover neighborhood or regional patterns associated with a targeted geographic location. The AI models 126 can learn new types of patterns, variations, and/or rules as new instances of datasets 122 and location specific data 124 are encountered.

Examples of algorithms that may be applied to train the AI models 126 can include one or more of: supervised learning, unsupervised learning, semi-supervised learning, and reinforcement learning. For instance, labeled training data can be provided to train the AI models 126 to find model parameters that assist in detecting unlabeled data in the data sets. Linear regression and linear classifiers can be used in some embodiments. Other embodiments may use decision trees, k-means, principal component analysis, neural networks, and/or other known machine-learning algorithms. Further, the AI models 126 may use a combination of machine learning techniques that can differ depending on whether the data set includes text, image data, and/or layered data. Layered data can refer to multiple types of data associated with the same location, such as visible spectrum image data, infrared image data, depth data, and the like. For example, supervised learning with entity extraction can be used to learn text values, while generative adversarial networks can be used for image learning.

A user application 132 executed on one or more of the user systems 106 may provide an interface to select locations for analysis. The user application 132 can interface with the process controller 128 to determine whether characteristics associated with a targeted location have recently been analyzed by the AI models 126 with results available. For instance, when a targeted location is not captured in the datasets 122 and location specific data 124 in data cache 120, the process controller 128 can access the aerial imagery data 119 to extract one or more datasets and access the property data 121 for analysis by the AI models 126. Values of the aerial imagery data 119 may be stored temporarily in the datasets 122 and values of the property data 121 may be stored temporarily in the location specific data 124. The process controller 128 may perform pre- and post processing on the datasets 122 and location specific data 124 prior to analysis by the AI models 126 and after results are determined by the AI models 126. The process controller 128 can store results of the AI models 126 in data storage to support longer term trending analysis. If the user application 132 requests a location analysis for a location that already has associated data in the data cache 120, the process controller 128 may check a date/time stamp associated with the datasets 122 and location specific data 124 to determine whether more recent data is available in the aerial imagery data 119 or property data 121. If more recent data is available, then the more recent data can be transferred to the data cache 120 and updated analysis performed using the AI models 126. If the data in the data cache 120 is still fresh, then the results of previous analysis can be provided back to the user application 132 to increase responsiveness and reduce network traffic between the enterprise network zone 101 and the external network zone 115.

In some embodiments, the user application 132 or another administrative application (not depicted) can configure one or more aspects of the AI models 126, for instance, to constrain features of interest for the AI models 126 to analyze. As an example, the user application 132 can operate in a two-dimensional analysis mode where image analysis is performed from a single viewing perspective to enhance responsiveness or a three-dimensional analysis mode where data from multiple viewing perspectives is combined to detect features in surfaces and contours that may not otherwise be discernable from a single viewing perspective. Further, the user application 132 may support a batch processing mode where a list of addresses is passed to the process controller 128 for analysis. The process controller 128 can create a plurality of records associated with batch processing for a plurality of properties and generate a sequence of processing requests based on the records. The processing requests can include a scoring computation, for instance, to estimate a condition, age, value, or other parameter associated with the identified features. In the case of preparing a quote for an insurance policy, a repair estimate, or other purpose, the result of a scoring computation based on comparing contents of a record to one or more scoring thresholds can be forwarded with the record to another application and/or user identifier associated with the property. Other processing and uses of the results from AI models 126 are contemplated and further described herein.

In the example of FIG. 1, each of the data processing server 102, user systems 106, data storage servers 110, and third-party servers 116 can include one or more processors (e.g., a processing device, such as one or more microprocessors, one or more microcontrollers, one or more digital signal processors) that receives instructions (e.g., from memory or like device), executes those instructions, and performs one or more processes defined by those instructions. Instructions may be embodied, for example, in one or more computer programs and/or one or more scripts. In one example, the system 100 executes computer instructions for implementing the exemplary processes described herein. Instructions that implement various process steps can be executed by different elements of the system 100. Although depicted separately, one or more of the data processing server 102, user systems 106, and/or data storage servers 110 can be combined or further subdivided. The system 100 can also include other subsystems (not depicted) that support processes which access and use data generated by the data processing server 102, user systems 106, data storage servers 110, and/or third-party servers 116.

The user systems 106 may each be implemented using a computer executing one or more computer programs for carrying out processes described herein. In one embodiment, the user systems 106 may each be a personal computer (e.g., a laptop, desktop, etc.), a network server-attached terminal (e.g., a thin client operating within a network), or a portable device (e.g., a tablet computer, personal digital assistant, smart phone, etc.). In an embodiment, the user systems 106 are operated by analysts seeking information about properties without having to physically travel to the properties. It will be understood that while only a single instance of the user systems 106 is shown in FIG. 1, there may be multiple user systems 106 coupled to the enterprise network 108 in embodiments.

Each of the data processing server 102, user systems 106, data storage servers 110, and third-party servers 116 can include a local data storage device, such as a memory device. A memory device, also referred to herein as "computer-readable memory" (e.g., non-transitory memory devices as opposed to transmission devices or media), may generally store program instructions, code, and/or modules that, when executed by a processing device, cause a particular machine to function in accordance with one or more embodiments described herein.

Figure 2:
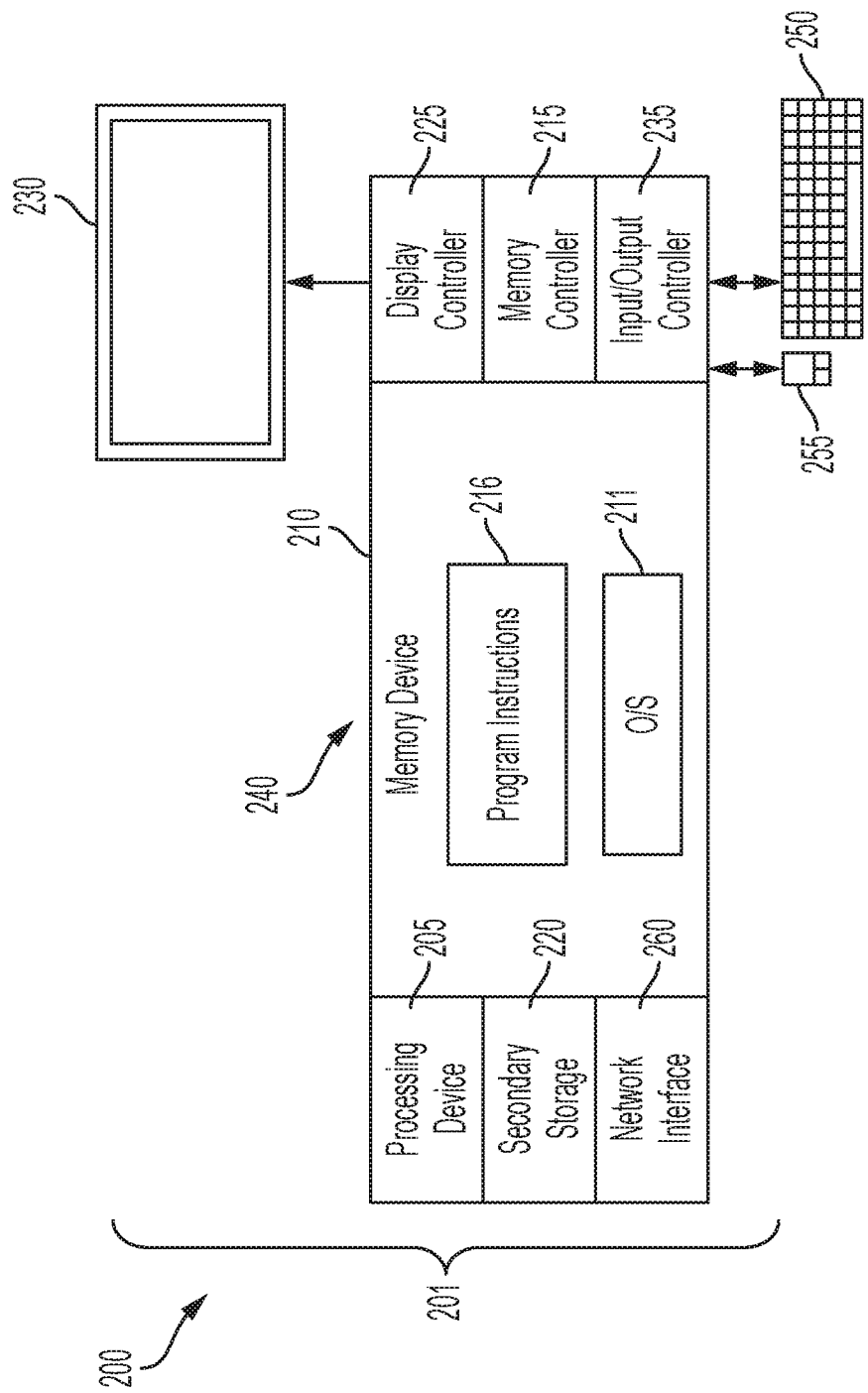
FIG. 2 depicts a block diagram of a system according to some embodiments of the present invention.

FIG. 2 depicts a block diagram of a system 200 according to an embodiment. The system 200 is depicted embodied in a computer 201 in FIG. 2. The system 200 is an example of one of the data processing server 102, user systems 106, data storage servers 110, and/or third-party servers 116 of FIG. 1.

In an exemplary embodiment, in terms of hardware architecture, as shown in FIG. 2, the computer 201 includes a processing device 205 and a memory device 210 coupled to a memory controller 215 and an input/output controller 235. The processing device 205 can also be referred to as a processing system 205 and may include multiple processors (e.g., one or more multi-core processors). The memory device 210 can also be referred to as a memory system 210 and may include multiple types of memory in various configurations, such as a combination memory cards and memory chips with volatile and/or non-volatile storage capacity. The input/output controller 235 may comprise, for example, one or more buses or other wired or wireless connections, as is known in the art. The input/output controller 235 may have additional elements, which are omitted for simplicity, such as controllers, buffers (caches), drivers, repeaters, and receivers, to enable communications. Further, the computer 201 may include address, control, and/or data connections to enable appropriate communications among the aforementioned components.

In an exemplary embodiment, a keyboard 250 and mouse 255 or similar devices can be coupled to the input/output controller 235. Alternatively, input may be received via a touch-sensitive or motion sensitive interface (not depicted). The computer 201 can further include a display controller 225 coupled to a display 230.

The processing device 205 comprises a hardware device for executing software, particularly software stored in secondary storage 220 or memory device 210. The processing device 205 may comprise any custom made or commercially available computer processor, a central processing unit (CPU), an auxiliary processor among several processors associated with the computer 201, a semiconductor-based microprocessor (in the form of a microchip or chip set), a macro-processor, or generally any device for executing instructions.

The memory device 210 can include any one or combination of volatile memory elements (e.g., random access memory (RAM, such as DRAM, SRAM, SDRAM, etc.)) and nonvolatile memory elements (e.g., ROM, erasable programmable read only memory (EPROM), electronically erasable programmable read only memory (EEPROM), flash memory, programmable read only memory (PROM), tape, compact disk read only memory (CD-ROM), flash drive, disk, hard disk drive, diskette, cartridge, cassette or the like, etc.). Moreover, the memory device 210 may incorporate electronic, magnetic, optical, and/or other types of storage media. Accordingly, the memory device 210 is an example of a tangible computer readable storage medium upon which instructions executable by the processing device 205 may be embodied as a computer program product. The memory device 210 can have a distributed architecture, where various components are situated remotely from one another, but can be accessed by one or more instances of the processing device 205.

The instructions in memory device 210 may include one or more separate programs, each of which comprises an ordered listing of executable instructions for implementing logical functions. In the example of FIG. 2, the instructions in the memory device 210 include a suitable operating system (O/S) 211 and program instructions 216. The operating system 211 essentially controls the execution of other computer programs and provides scheduling, input-output control, file and data management, memory management, and communication control and related services. When the computer 201 is in operation, the processing device 205 is configured to execute instructions stored within the memory device 210, to communicate data to and from the memory device 210, and to generally control operations of the computer 201 pursuant to the instructions. Examples of program instructions 216 can include instructions to implement the third-party services 118, AI models 126, process controller 128, and/or user application 132 of FIG. 1.

The computer 201 of FIG. 2 also includes a network interface 260 that can establish communication channels with one or more other computer systems via one or more network links. The network interface 260 can support wired and/or wireless communication protocols known in the art. For example, when embodied in one of the user systems 106 of FIG. 1, the network interface 260 can establish communication channels with at least one of the data processing server 102 or data storage servers 110 via the enterprise network 108 and/or with third-party servers 116 via external network 114.

Figure 3:
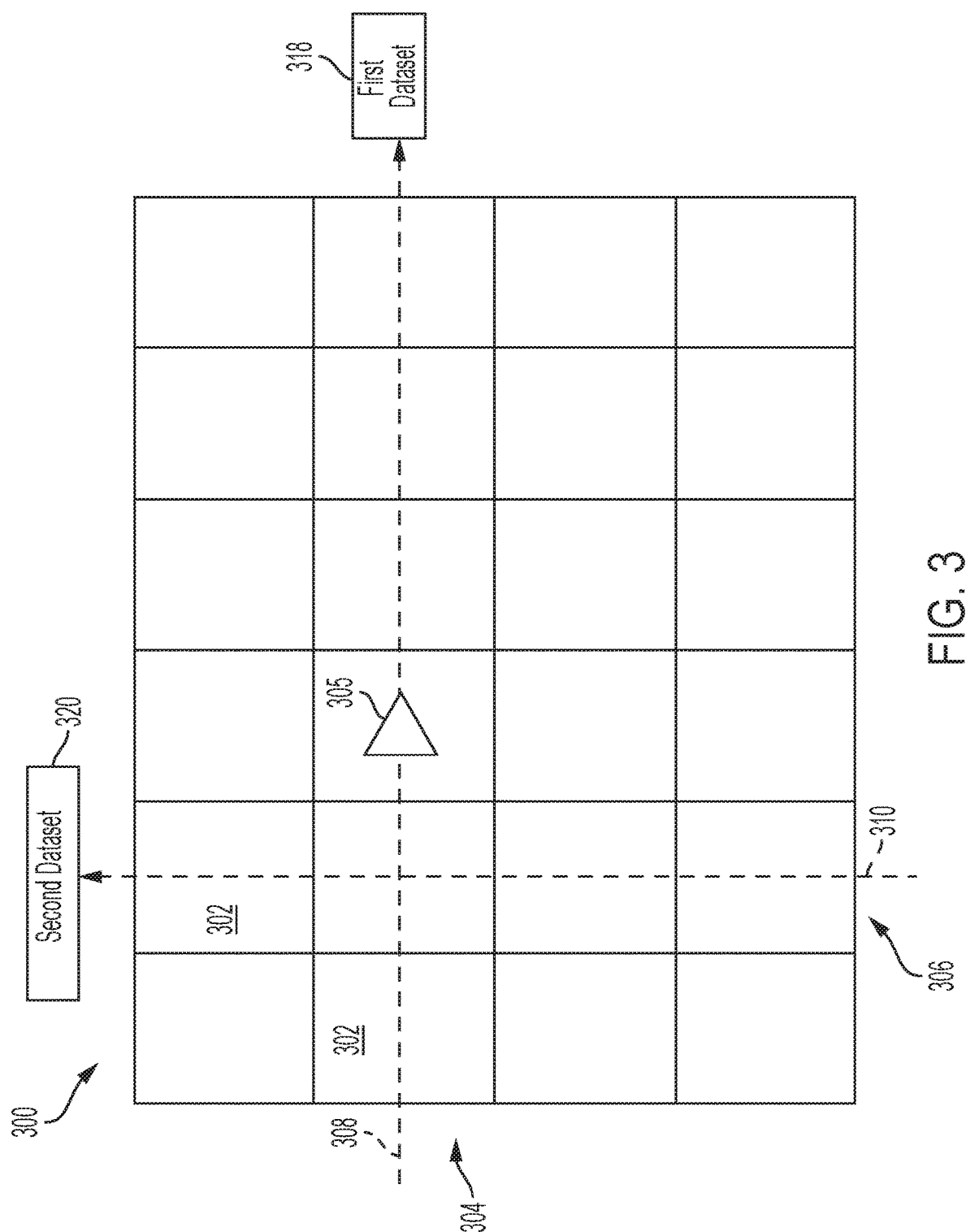
FIG. 3 depicts a data collection pattern according to some embodiments of the present invention.

FIG. 3 depicts a data collection pattern according to some embodiments. The data collection pattern can include capturing of data using a grid pattern 300. The grid pattern 300 may include a plurality of grid cells 302 that represent a geographic area as observed from a substantially consistent altitude forming a plurality of grid rows 304 and grid columns 306. A mobile observation platform 305 can travel in a first direction, such as across a grid row 304, to capture images and/or other types of data from a first viewing perspective 308 in a first dataset 318. For example, the mobile observation platform 305 can be an aircraft, such as an airplane, helicopter, drone, or the like. The sensing capabilities of the mobile observation platform 305 can include at least one camera configured to capture images or video in a visible spectrum across the grid rows 304. In some embodiments, the mobile observation platform 305 can capture layered data by capturing images using an infrared camera, a depth camera (e.g., LIDAR), and/or other imaging techniques known in the art. The mobile observation platform 305 can also traverse the same geographic area to capture images and/or other types of data across grid columns 306 of the grid pattern 300 from a second viewing perspective 310 in a second dataset 320. Data captured across the grid pattern 300 may be postprocessed to stitch the images together to make a larger scale area map that seamlessly links the grid cells 302 together. In some embodiments, the intermediate images of multiple frames captured may also be retained to show changing perspectives as the mobile observation platform 305 travels, which may reveal details that are obstructed when viewed from directly overhead or at an alternate angle of observation. As compared to conventional regional views of aerial imagery, which may be constrained to a resolution of about 50 cm per pixel, the aerial imagery data captured in the first dataset 318 and second dataset 320 may have a resolution of 7.5 cm per pixel, for example, which enables finer details to be observed. Sizing of the grid cells 302 can vary from a pixel-level to multiple meters or kilometers depending on the observation range, altitude during data collection, and zoom level set during data gathering. Although depicted as a uniform distribution of rectangular-shaped grid cells 302 for purposes of illustration, it will be understood that the grid pattern 300 can be a collection of non-uniform shaped polygons and may include partial boundaries. For instance, a coordinate space of the grid pattern 300 can align with property boundaries, which may have any orientation or shape, e.g., as impacted by features of the underlying terrain and other such constraints. Any type of coordinate system or coordinate transformation process may be supported.

Figure 4:
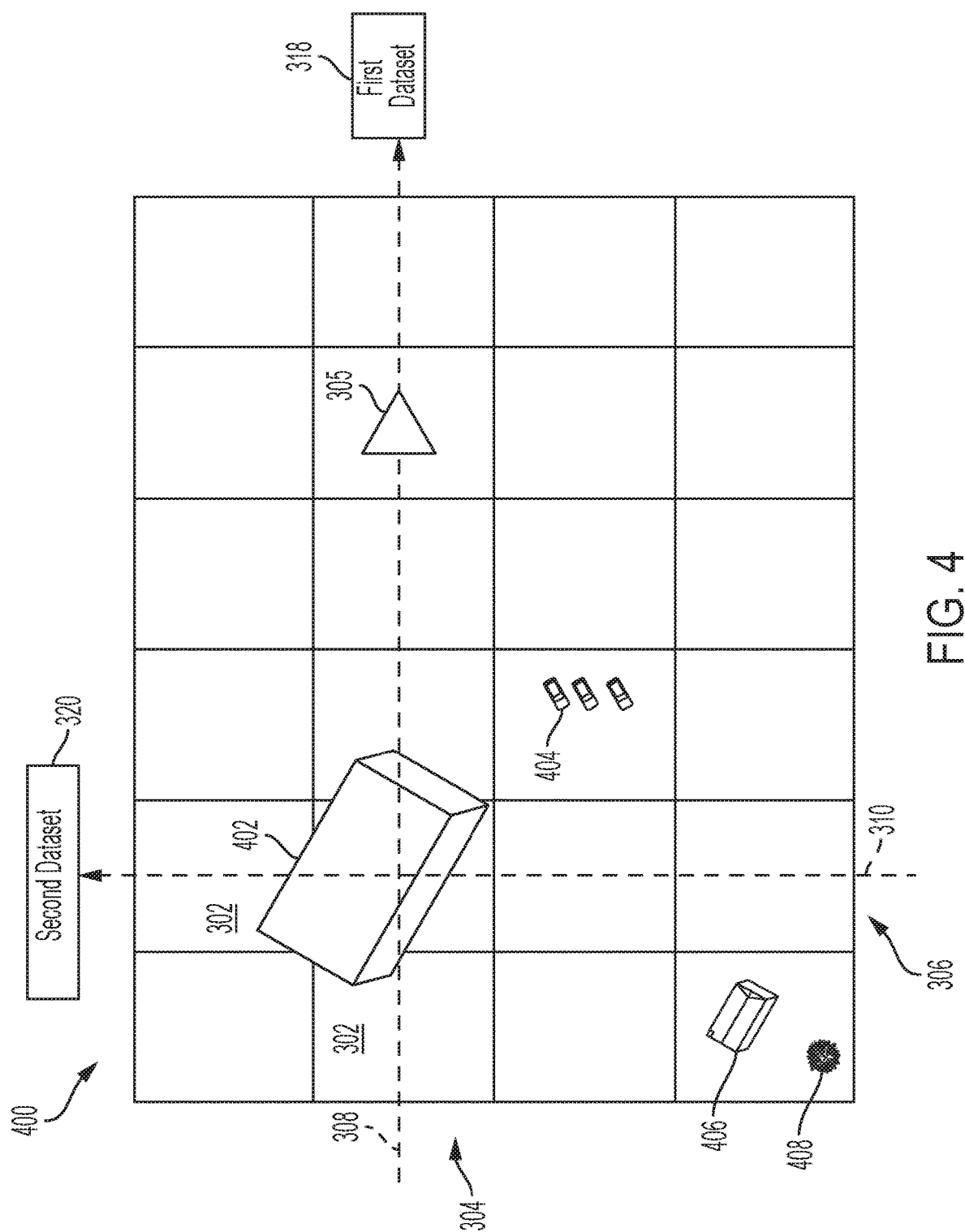
FIG. 4 depicts a simplified view of various objects that may be observed using the data collection pattern of FIG. 3 according to some embodiments of the present invention.

FIG. 4 depicts a simplified view of various objects that may be observed using the data collection pattern of FIG. 3 according to embodiments. In FIG. 4, a grid pattern 400 includes a different geographic area than that depicted in FIG. 3. The simplified example of FIG. 4 depicts how the mobile observation platform 305 may observe features on the ground from at least two different viewing perspectives, including the first viewing perspective 308 and the second viewing perspective 310 to form grid rows 304 and grid columns 306 of grid cells 302. Further, the mobile observation platform 305 may include cameras pointing in a direction of travel of the mobile observation platform 305 and in an opposite direction to the direction of travel. Thus, a structure, such as a building 402, a car 404, a house 406, vegetation 408, and/or other observable features, can be captured on approach, from above, and on egress from the first viewing perspective 308 and the second viewing perspective 310, such that a complete view is captured in the combination of the first dataset 318 and the second dataset 320.

Figure 5:
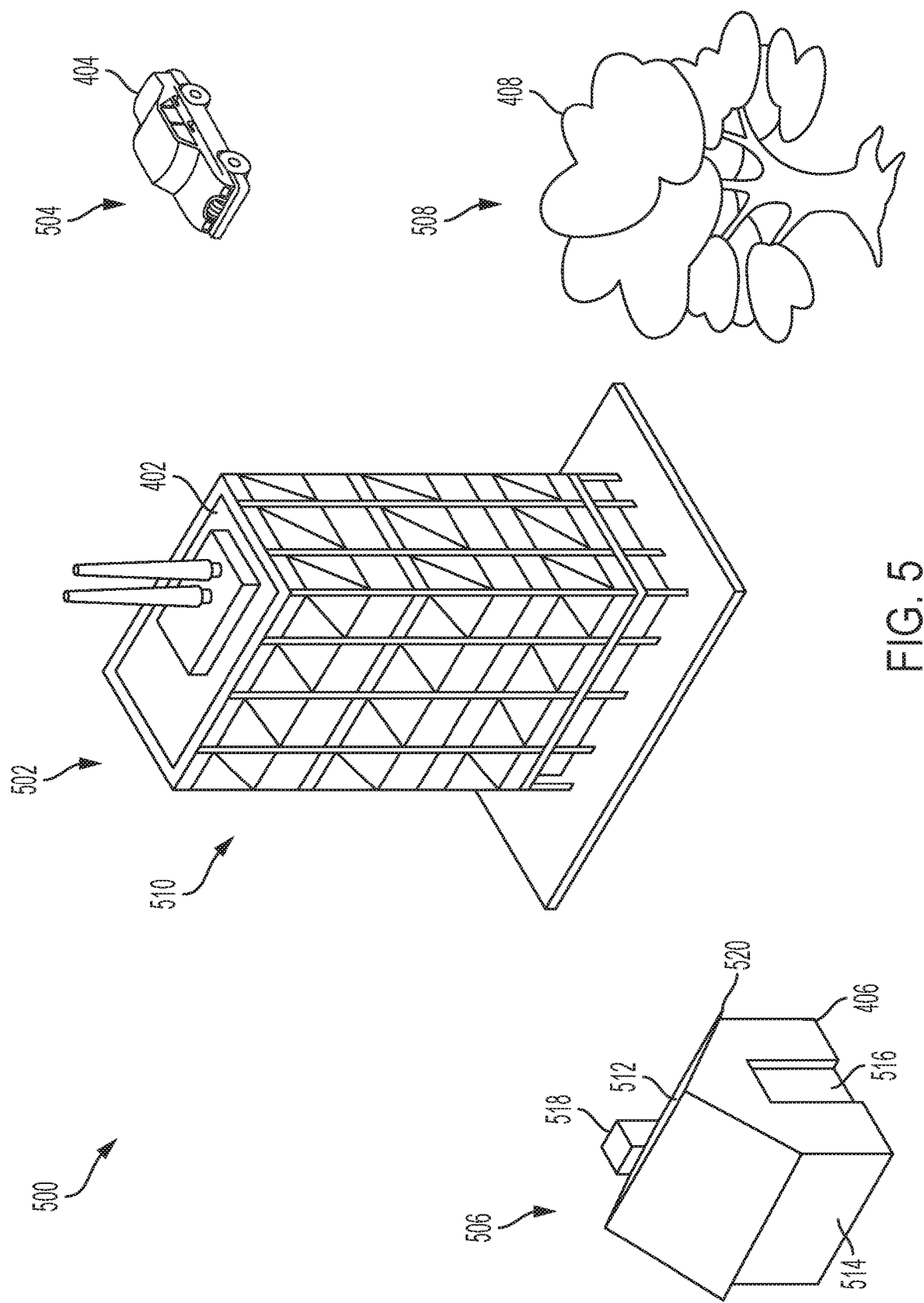
FIG. 5 depicts examples of partial three-dimensional models that can be constructed from multiple datasets according to some embodiments of the present invention.

FIG. 5 depicts examples of partial three-dimensional models 500 that can be constructed from multiple datasets according to embodiments. The data processing server 102 of FIG. 1 can merge data from the first dataset 318 and the second dataset 320 of FIG. 4 to create various partial three-dimensional models 502, 504, 506, 508. A partial three-dimensional model 502 of building 402 of FIG. 4 can enable viewing of various details, such as a number of floors 510. A partial three-dimensional model 504 of car 404 of FIG. 4 can enable viewing of the condition or preexisting damage to components of the car 404 for portions that are visible. In the example of the car 404, it may be difficult to discern certain features if parked in close proximity to other vehicles, structures, or other obstructions. A partial three-dimensional model 506 of the house 406 of FIG. 4 can enable viewing of details, such as a roof 512, siding 514, windows/doors 516, a chimney 518, an overhang 520, and other such features, including features in proximity to the house 406. A partial three-dimensional model 508 of the vegetation 408 of FIG. 4 can enable a determination of the approximate height, area, and condition of the vegetation 408. Other such features captured in the first dataset 318 and the second dataset 320 can be modeled as well. In some embodiments, the formation of the partial three-dimensional models 500 can be performed by another entity, such as the third-party servers 116 of FIG. 1. The partial three-dimensional models 500 may have varying levels of detail, such that data relating to features of interest is more fully defined in the context of three-dimensional space, while other potentially observable features are rendered in two-dimensional space. In some embodiments having sufficient processing and memory bandwidth, full three-dimensional models can be rendered rather than partial three-dimensional models 500. As a greater level of detail is desired for a feature of interest, multiple viewing perspectives can be accessed to corelate different views, such as a planimetric image with one or more viewing perspectives to identify related details in three-dimensional space.

Figure 6:
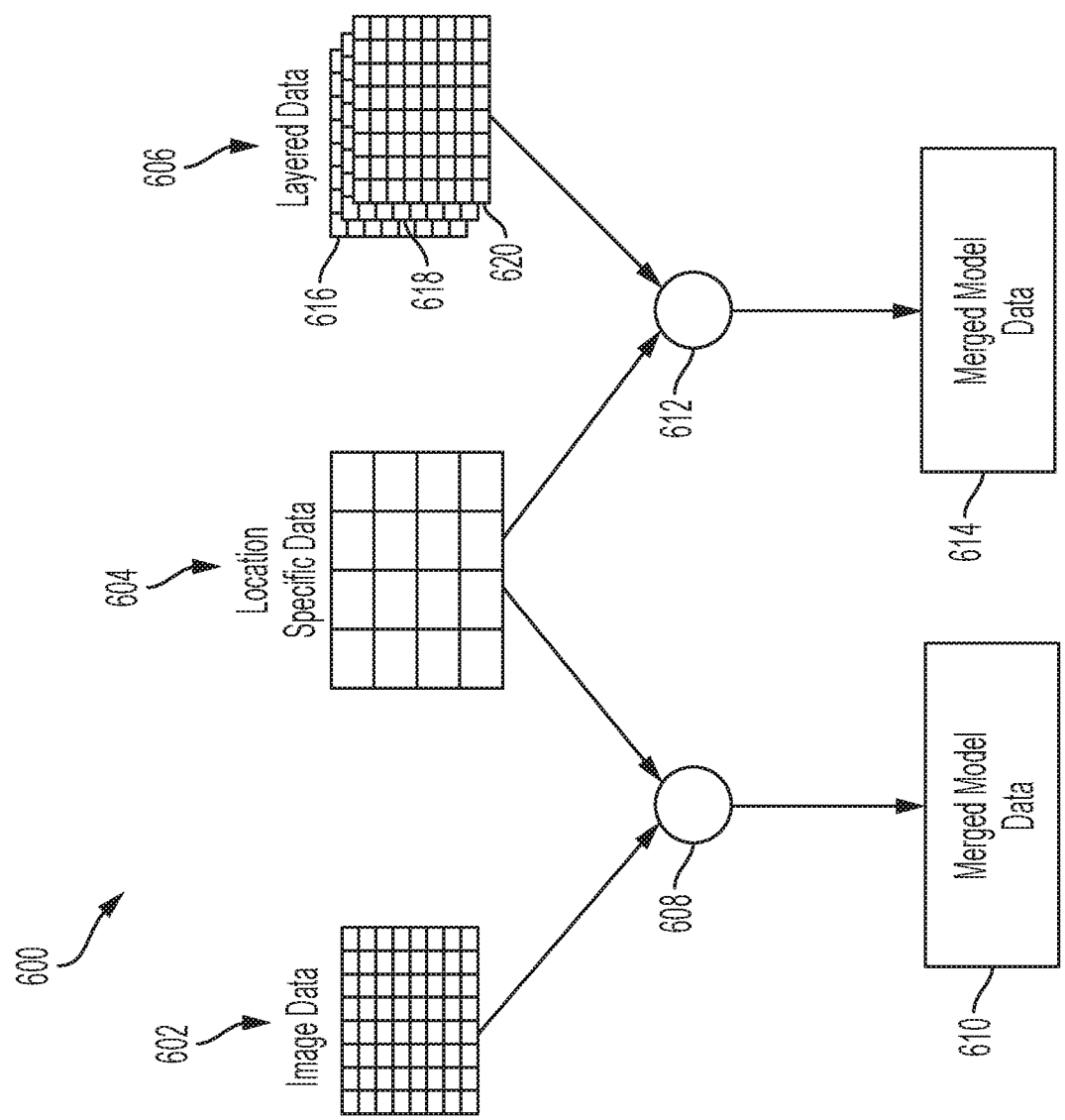
FIG. 6 depicts a data merging process to form merged model data according to some embodiments of the present invention.

FIG. 6 depicts a data merging process 600 to form merged model data according to some embodiments. Different types of data with different resolution can be merged by the data processing server 102 of FIG. 1. As an example, image data 602 can be accessed from the aerial imagery data 119 of FIG.

1 and be stored as part of datasets 122 of FIG. 1. Location specific data 604 can be accessed from the property data 121 of FIG. 1 and/or other sources and be stored as part of location specific data 124 of FIG. 1. Pixels of image data 602 can represent very small areas (e.g., cm scale), while the location specific data 604 may represent data at a different scale or different units (e.g., coordinate system) to define a property location and boundaries. The data processing server 102 can perform processing to map location information represented in the image data 602 to location information represented in the location specific data 604. Data merging 608 can link or otherwise combine portions of the image data 602 and location specific data 604 into a combined format that can be understood by the AI models 126 of FIG. 1 as merged model data 610. Similarly, where more detailed data is available, such as layered data 606, a separate data merging 612 can be used to form merged model data 614 that links or combines the location specific data 604 with the layered data 606. As an example, the layered data 606 can include two or more of a visible light image layer 616, an infrared image layer 618, and a depth layer 620. The data merging 608, 612 can enable inputs having various characteristics and scaling to be normalized or otherwise preprocessed for use by the AI models 126. With respect to the first dataset 318 from the first viewing perspective 308 and the second dataset 320 from the second viewing perspective 310, each dataset 318, 320 may have separate merged model data 610, 614 to perform perspective-specific or simplified analysis. The partial three-dimensional models 500 can have separate combinations of the merged model data 610, 614 formed as merged with location specific data 604, if desired. It will be understood that any number of data sources can be merged, and in some embodiments, data sources can be processed using the AI models 126 without merging. In some embodiments, the data merging process 600 can be performed by another entity, such as the third-party servers 116 of FIG. 1. Although depicted as uniform grids in FIG. 6, the location specific data 604 may be formed of irregular polygons. Further, layers 616, 618, and 620 may have different resolutions and/or non-uniformity of distribution depending on the resolution and collection perspective of underlying sensors used to collect data. Embodiments can manage different coordinate spaces or make function calls to existing space transformation services to enable the different coordinate spaces to be correlated.

Figure 7:
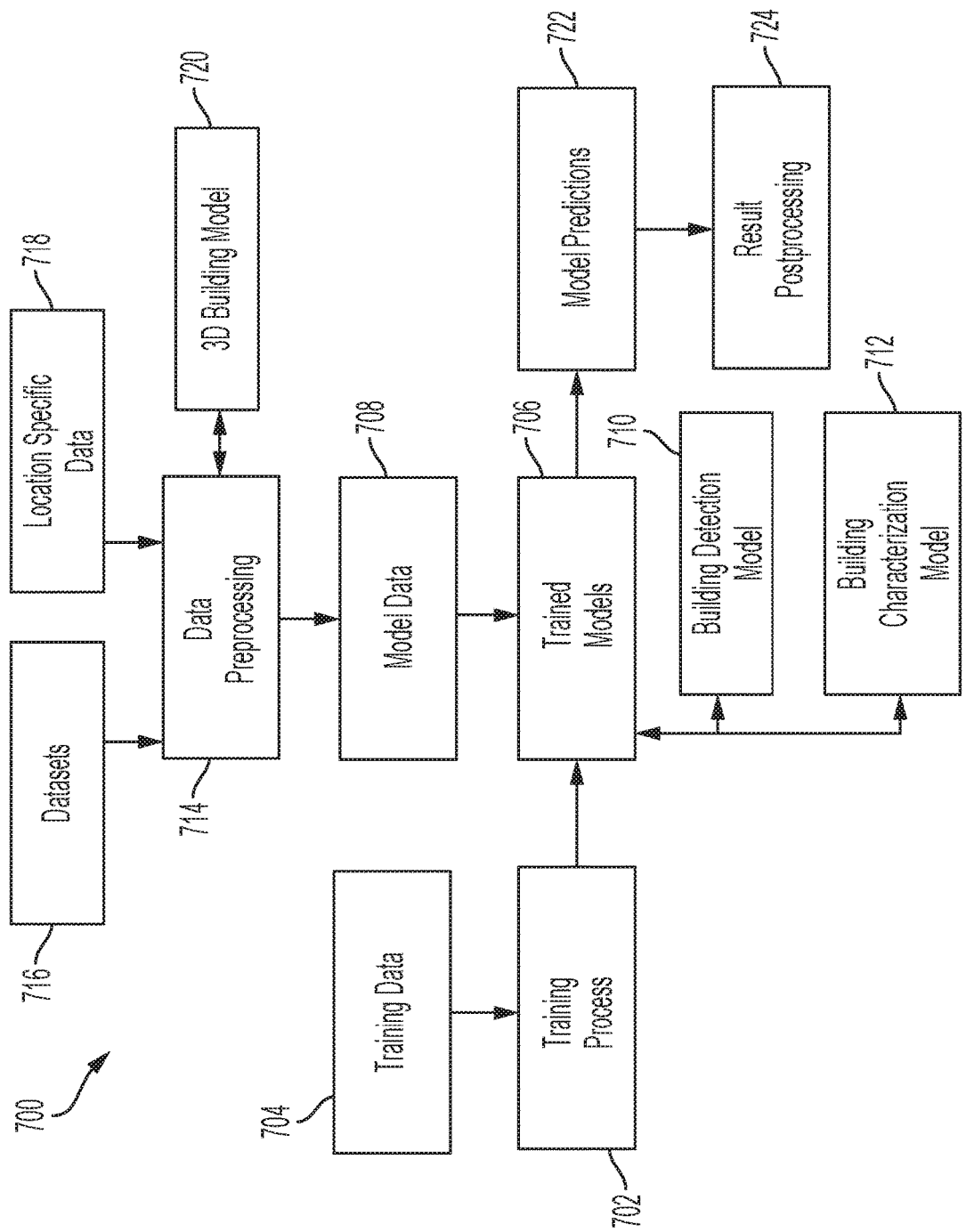
FIG. 7 depicts a training and prediction process according to some embodiments of the present invention.

FIG. 7 depicts a training and prediction process 700 according to some embodiments. The training and prediction process 700 can include a training process 702 that analyzes training data 704 to develop trained models 706 as examples of the AI models 126 of FIG. 1. The training process 702 can use labeled or unlabeled data in the training data 704 to learn features, such as a building footprint, roof identification, construction material type, various property features, and/or other derived characteristics. The training data 704 can include a set of training images and other data to establish a ground truth for learning coefficients/weights and other such features known in the art of machine learning to develop trained models 706. The trained models 706 can include a family of models to identify specific types of features from model data 708. For example, the trained models 706 can include a building detection model 710 and a building characterization model 712. Other such models and further subdivision of the trained models 706 can be incorporated in various embodiments. The building detection model 710 can predict, for instance, a roof location of a building based on individual pixel data and an aggregation of the individual pixel data. The building characterization model 712 can identify the number of floors of a building based on a three-dimensional model or other data. Further, the building characterization model 712 can be tuned to look for specific features, such as identifying a roof overhang of the building based on a three-dimensional model or other data. Distinguishing features, such as overhangs, can improve the accuracy of building footprint determinations of the underlying structure below the roof.

The model data 708 can include the merged model data 610, 614 of FIG. 6 or other such data available to apply the trained models 706. Datasets 716 and location specific data 718 are embodiments of the datasets 122 and location specific data 124 of FIG. 1, where data preprocessing 714 can be applied to produce the model data 708. The data preprocessing 714 can include the data merging 608, 612 of FIG. 6 and creation or access of a partial three-dimensional building model 720, such as the partial three-dimensional model 502 of building 402 of FIG. 5.

Applying the trained models 706 to the model data 708 can result in model predictions 722. The model predictions 722 can predict whether a pixel of image data is likely part of a building, for example, and whether the pixel represents a feature, such as a roof, siding, decking, door, or window, for instance. As greater details are refined, the trained models 706 can make more specific predictions for one or more derived characteristics of a building, such as a roofing material, a roof shape, a siding material, a solar panel presence, a window count, a window size, a skylight presence, and a chimney condition. The trained models 706 may also predict whether pixels represent one or more property features, such as one or more of a deck, a shed, a pool, a patio, a garage, a playscape, a greenhouse, a fence, a driveway, an unknown structure, and/or a property hazard. The results of model predictions 722 can be further conditioned by result postprocessing 724. The result postprocessing 724 can cross-compare results of the model predictions 722 to make a final determination of the most likely feature and/or condition captured by a pixel or group of pixels. The result postprocessing 724 can summarize results to highlight regions, such as pixels collectively grouped as a roof of a single structure, as well as other associated data.

Figure 8:
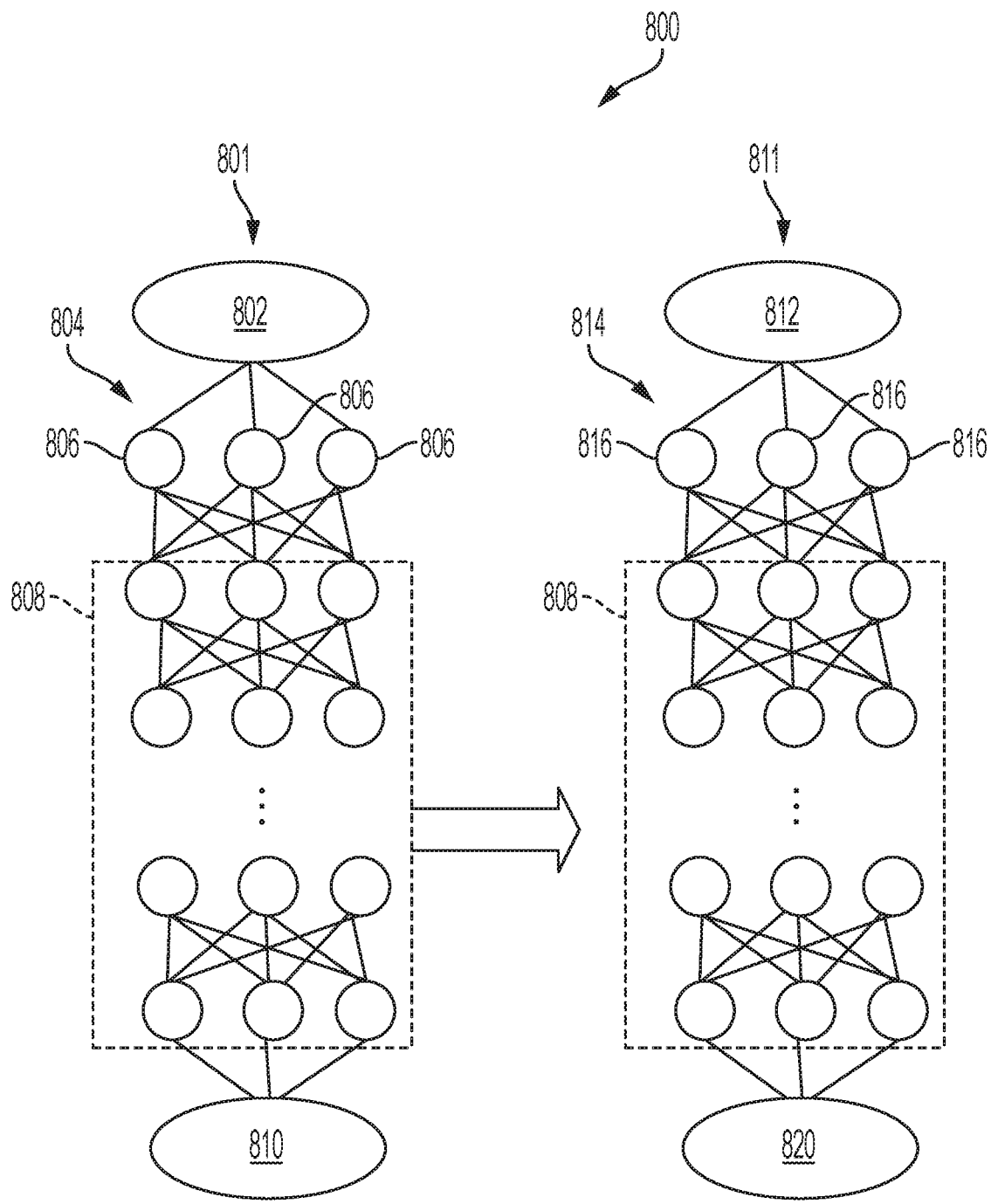
FIG. 8 depicts a model training transfer process according to some embodiments of the present invention.

FIG. 8 depicts a model training transfer process 800 according to some embodiments. The model training transfer process 800 can use an existing one of the trained models 706 of FIG. 7 to train other models. For instance, once a roof detection model is trained, a similarly structured model can be used for siding detection, as both have similar features, such as large similarly patterned areas with edges, corners, and the like. As an example, a first trained model 801 can include a model head 802 that defines initial parameters followed by a plurality of model stages 804. The model stages 804 can include a structure of nodes 806 forming a neural network or belief network with various weights and parameters that flow through a model core 808 to a first model result 810. The model core 808 can include a number of lower level relationships to identify characteristics, such as uniformity, edges, and the like. The model core 808 can include one or more model stages 804 of interrelated nodes 806 between the model head 802. Although depicted as three nodes 806 per model stage 804, it will be understood that any number of nodes 806 can be included per model stage 804, including a varying number per model stage 804. The model training transfer process 800 can include transferring the model core 808 after training of the first trained model 801 is complete to act as a starting point for training of a second model 811. The second model 811 can include a model head 812 that defines initial parameters followed by a plurality of model stages 814. The model stages 814 can include a structure of nodes 816 forming a neural network or belief network with various weights and parameters that flow through a copy of the model core 808 of the first trained model 801 to a second model result 820. Starting the training of the second model 811 with the model core 808 of the first trained model 801 can decrease the amount of processing time needed for the second model 811 to complete training.

Figure 9:
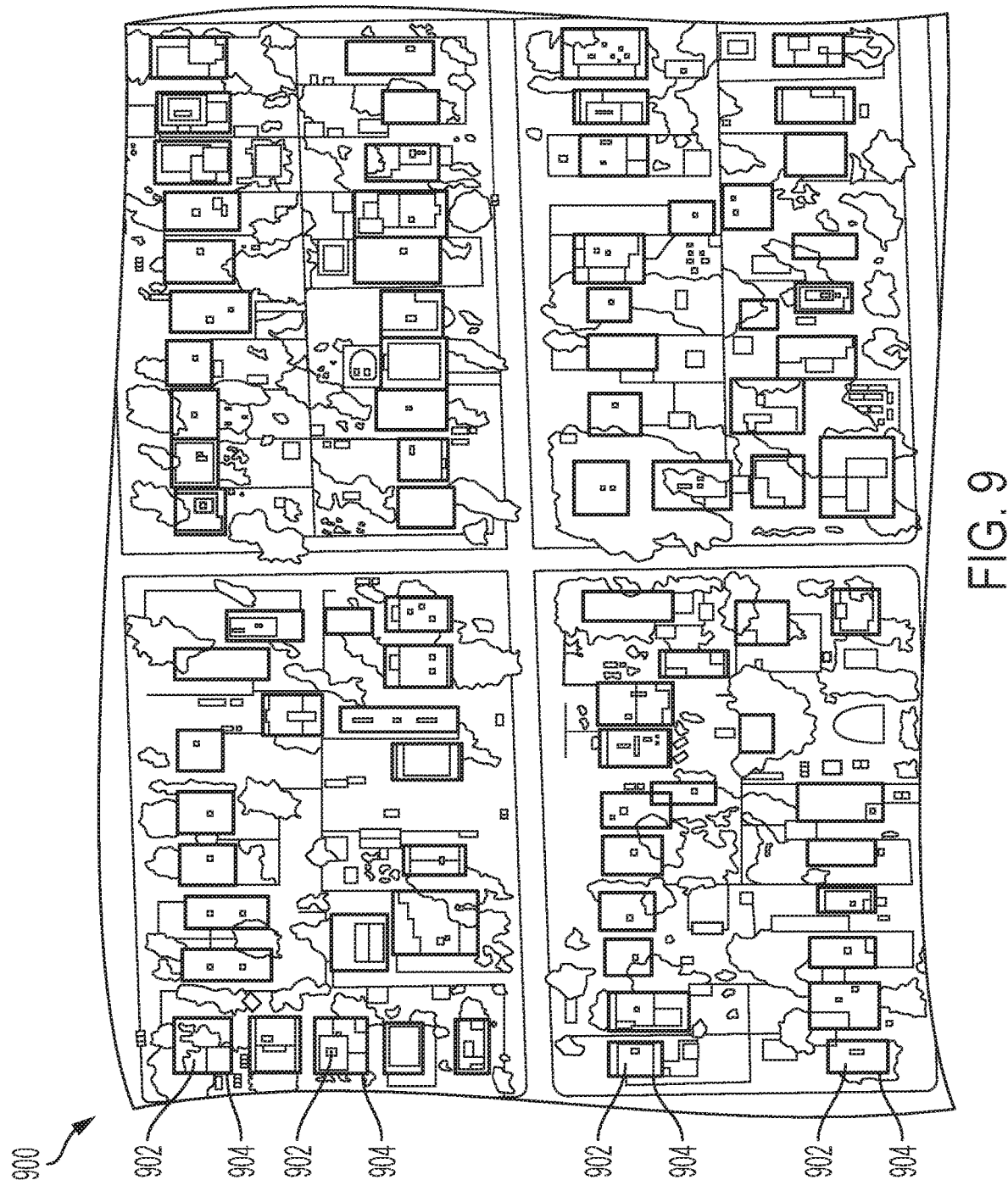
FIG. 9 depicts a wide-scale image feature identification example according to some embodiments of the present invention.

FIG. 9 depicts a wide-scale image feature identification according to some embodiments. In FIG. 9, an aerial image 900 from the aerial imagery data 119 of FIG. 1 is depicted and includes a plurality of buildings 902. The buildings 902 can be identified at locations 904 to serve as part of the training data 704 of FIG. 7. As the building detection model 710 of FIG. 7 is trained with data, such as aerial image 900, subsequent images from the aerial imagery data 119 that do not include identification or labels can be processed by the building detection model 710 as part of wide-scale image feature identification where multiple buildings 902 are depicted in the same image. After training, the building detection model 710 can detect locations 904 of buildings 902 in subsequent iterations.

Figure 10:
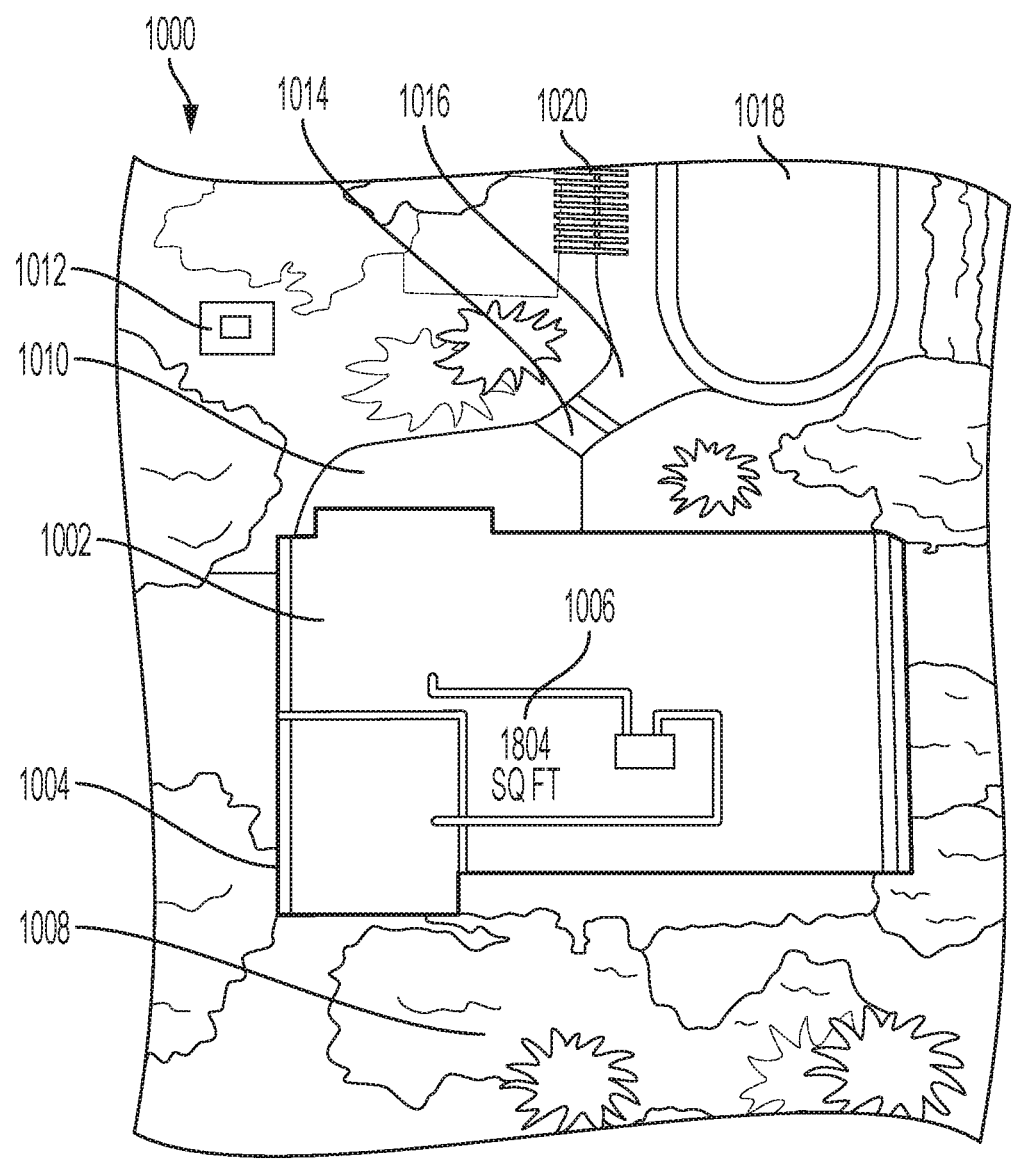
FIG. 10 depicts a detailed image feature identification example according to some embodiments of the present invention.

FIG. 10 depicts a detailed image feature identification according to some embodiments. With respect to an aerial image 1000 from aerial imagery data 119 of FIG. 1, a number of features can be identified using the building detection model 710 and building characterization model 712 of FIG. 7, along with other trained models 706 of the AI models 126 of FIG. 1. For instance, the building detection model 710 can be applied to identify a footprint 1004 of a building 1002 based on a first dataset 318 that includes the aerial image 1000 from the first viewing perspective 308 (e.g., overhead) of FIG. 3. The building area 1006 can be computed based on the footprint 1004. From the first viewing perspective 308, it may not be possible to determine a number of levels of the building 1002. If a second dataset 320 is available with a second viewing perspective 310, the number of levels can be determined as a derived characteristic. An area of the property upon which the building 1002 is situated can be approximated by correlation with the property data 121 of FIG. 1. Property lines or boundaries that are not visible in the aerial image 1000 can be learned by the AI models 126 through the data merging with the property data 121. The geographic area of the building 1002 can be further analyzed using the AI models 126 to discover other features of the property, such as vegetation 1008, a patio 1010, a firepit 1012, a walkway 1014, decking 1016, a swimming pool 1018, a pergola 1020, and other such features.

Figure 11:
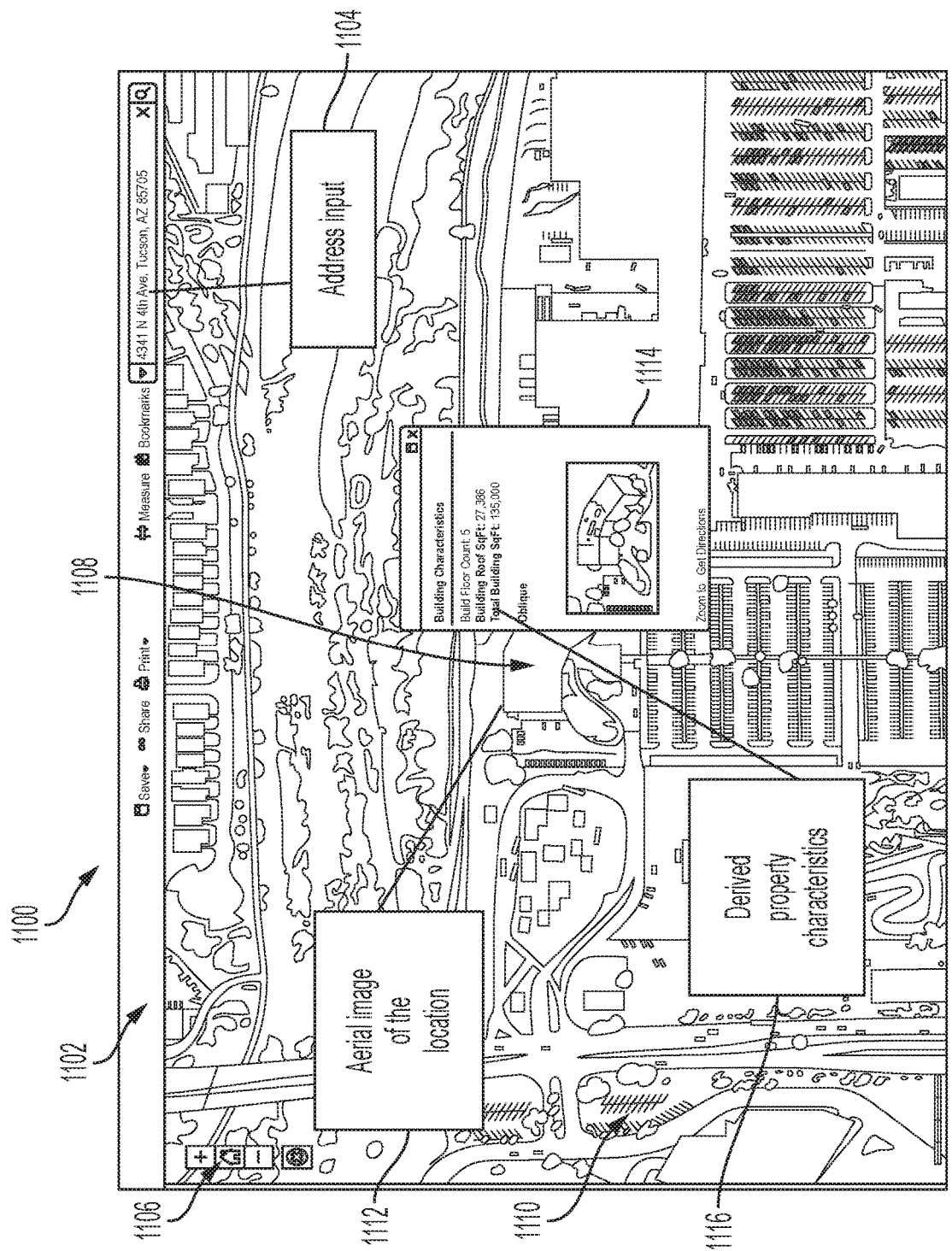
FIG. 11 depicts a user interface according to some embodiments of the present invention.

FIG. 11 depicts a user interface 1100 according to some embodiments. In the example of FIG. 11, the user interface 1100 can be used to allow a user to select details of an image of the aerial imagery data 119 of FIG. 1 through the user application 132 of FIG. 1. The user interface 1100 can provide a graphical user interface 1102 to select commands, provide address input 1104 and control image viewing with an image control interface 1106. The example of FIG. 11 indicates that a building 1108 at a location associated with address input 1104 is highlighted for analysis in contrast to other background details 1110 visible in the user interface 1100. Based on the AI models 126 of FIG. 1, an aerial image of a location 1112 can be displayed along with a pop-up window 1114 that provides the derived characteristics 1116 of the building 1108 determined by the AI models 126. For instance, the derived characteristics 1116 can include a number of floors, a roof area estimation and a building area estimation in view of the footprint of the building 1108 and number of floors. Other features and derived characteristics may also or alternatively be displayed through the user interface 1100. Although one example is depicted in FIG. 11, it will be understood that many variations are contemplated, including additional interfaces, command options, and identification options.

FIG. 12 depicts a process 1200 using intelligent imagery for rating and quoting according to some embodiments. The process 1200 can be performed, for example, by the system 100 of FIG. 1. Visual high resolution aerial imagery is queried 1202 for a location of interest, for instance, from aerial imagery data 119 of FIG. 1. Information on individual locations 1204 can be captured on a location-by-location basis and may be accessed from the property data 121 of FIG. 1. A data merging process 1206 can combine the data and pass merged data through one or more AI models 126 of FIG. 1 to test for the presence of particular attributes at block 1208, such as the presence of solar panels, flat roofs, and other such derived characteristics. The output of the AI models 126 can be scores that are fed to a rate-quote-issue system 1210, which may be part of system 100 of FIG. 1 or located in another networked environment. In some embodiments, a processing request output to the rate-quote-issue system 1210 can include population of one or more electronic forms in the rate-quote-issue system 1210 as a second system based on a record resulting from the AI models 126 at block 1208. Scores from the rate-quote-issue system 1210 can be fed to a rating engine 1212. A quote can be submitted 1214 from the rating engine 1212 to an end user/customer. The process 1200 can be initiated through the user application 132 and managed by the process controller 128 of FIG. 1 in combination with one or more other applications (not depicted).

Figure 13A:
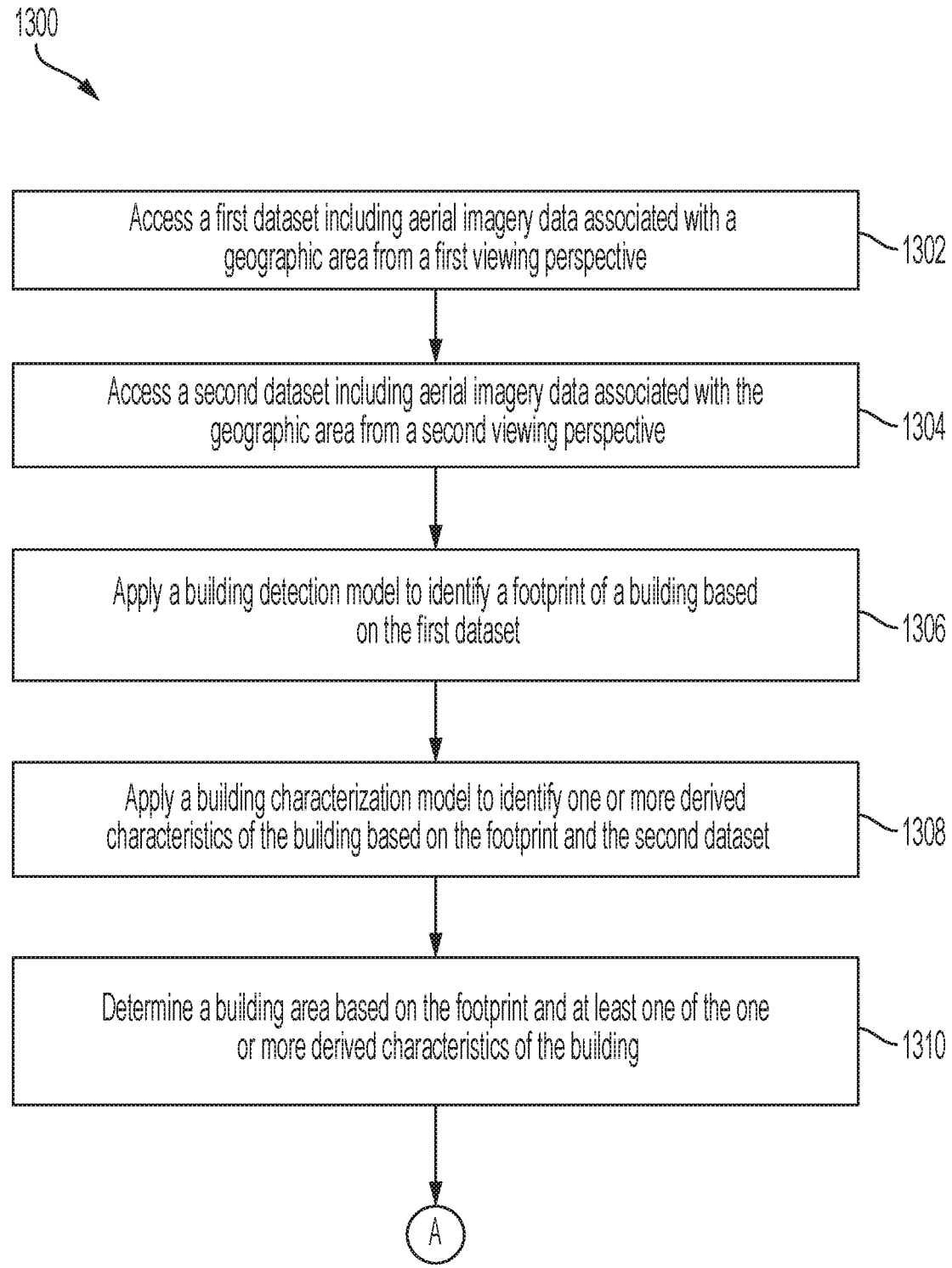
FIGS. 13A and 13B depict a process flow according to some embodiments of the present invention.
Figure 13B:
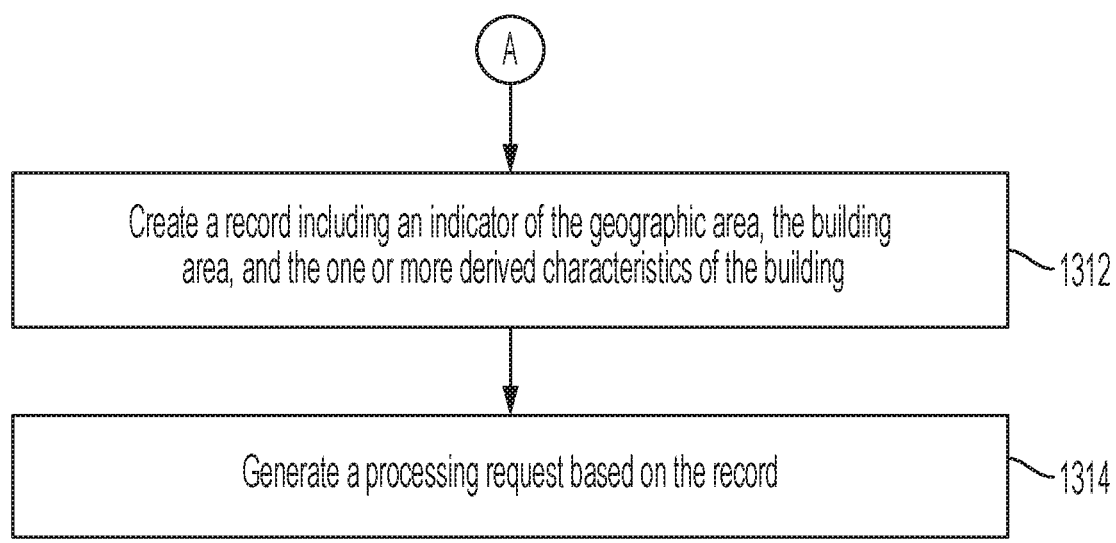

Turning now to FIGS. 13A and 13B, a process flow 1300 is depicted according to an embodiment. The process flow 1300 includes a number of steps that may be performed in the depicted sequence or in an alternate sequence. The process flow 1300 may be performed by the system 100 of FIG. 1. In one embodiment, the process flow 1300 is performed by the data processing server 102 of FIG. 1 in combination with the one or more user systems 106 and/or the one or more data storage servers 110. The process flow 1300 is described in reference to FIGS. 1-13B.

At step 1302, the data processing server 102 can access a first dataset 318 including aerial imagery data 119 associated with a geographic area from a first viewing perspective 308. At step 1304, the data processing server 102 can access a second dataset 320 including aerial imagery data 119 associated with the geographic area from a second viewing perspective 310. The aerial imagery data 119 can be accessed through one or more third-party services 118 or from a local copy of datasets 122 in a data cache 120. In some embodiments, step 1304 is omitted where a single viewing perspective is deemed sufficient to identify features of interest and determine derived characteristics. Where the first dataset 318 and the second dataset 320 are used, the aerial imagery data 119 associated with the geographic area from the first viewing perspective and the second viewing perspective can be aligned based on one or more grid patterns 300, 400.

At step 1306, the data processing server 102 can apply a building detection model 710 to identify a footprint of a building based on the first dataset 318. The building detection model 710 can include an artificial intelligence model that predicts a roof location of the building based on individual pixel data and an aggregation of the individual pixel data, for example.

At step 1308, the data processing server 102 can apply a building characterization model 712 to identify one or more derived characteristics of the building based on the footprint. In some embodiments, the building characterization model 712 is applied to identify one or more derived characteristics of the building based on the footprint and the second dataset 320. The first dataset 318 can be merged with the second dataset 320 to construct a partial three-dimensional model 502 of the building. The building characterization model 712 can identify a number of floors 510 of the building based on the partial three-dimensional model 502. In some embodiments, the building characterization model 712 can identify a roof overhang 520 of the building based on the partial three-dimensional model 502. The one or more derived characteristics of the building can include, for example, a roofing material, a roof shape, a siding material, a solar panel presence, a window count, a window size, a skylight presence, and a chimney condition. At step 1310, the data processing server 102 can determine a building area based on the footprint and at least one of the one or more derived characteristics of the building.

At step 1312, the data processing server 102 can create a record including an indicator of the geographic area, the building area, and the one or more derived characteristics of the building. The record can be held temporarily in the data cache 120 and/or may be captured for longer term retention in the data storage 134.

At step 1314, the data processing server 102 can generate a processing request based on the record. The processing request can include, for example, population of one or more electronic forms in a second system, such as the rate-quote-issue system 1210, based on the record. Further, the processing request can include a scoring computation based on comparing contents of the record to one or more scoring thresholds, forwarding a result of the scoring computation with the record for a quote, and sending the quote to a user identifier associated with the property, for instance, as part of process 1200.

The process flow 1300 can be performed responsive to user requests through one or more user applications 132. The data processing server 102 and/or one or more user systems 106 can provide an interactive interface through a graphical user interface, such as user interface 1100. The interactive user interface can highlight the footprint and/or other features on the graphical user interface 1102. Further, the interactive interface can generate a visual indicator on the graphical user interface 1102 based on the one or more derived characteristics of the building, such as highlighting a building 1108 at location 1112 and providing information in a pop-up window 1114. The geographic area can also be identified on the interactive interface based on a user input at the graphical user interface 1102. In some embodiments, the data processing server 102 can perform batch processing for a plurality of properties to create a plurality of records and generate a sequence of processing requests based on the records.

Training of the building detection model 710 and the building characterization model 712 can be based on a plurality of training sets, such as training data 704, including a plurality of property images labeled by pixel boundaries. Training can be performed by the data processing server 102 or by a development server (not depicted). Either or both of the building detection model 710 and the building characterization model 712 can be partially retrained models based on one or more previously trained models, such as the first trained model 801 and the second model 811.

Figure 14A:
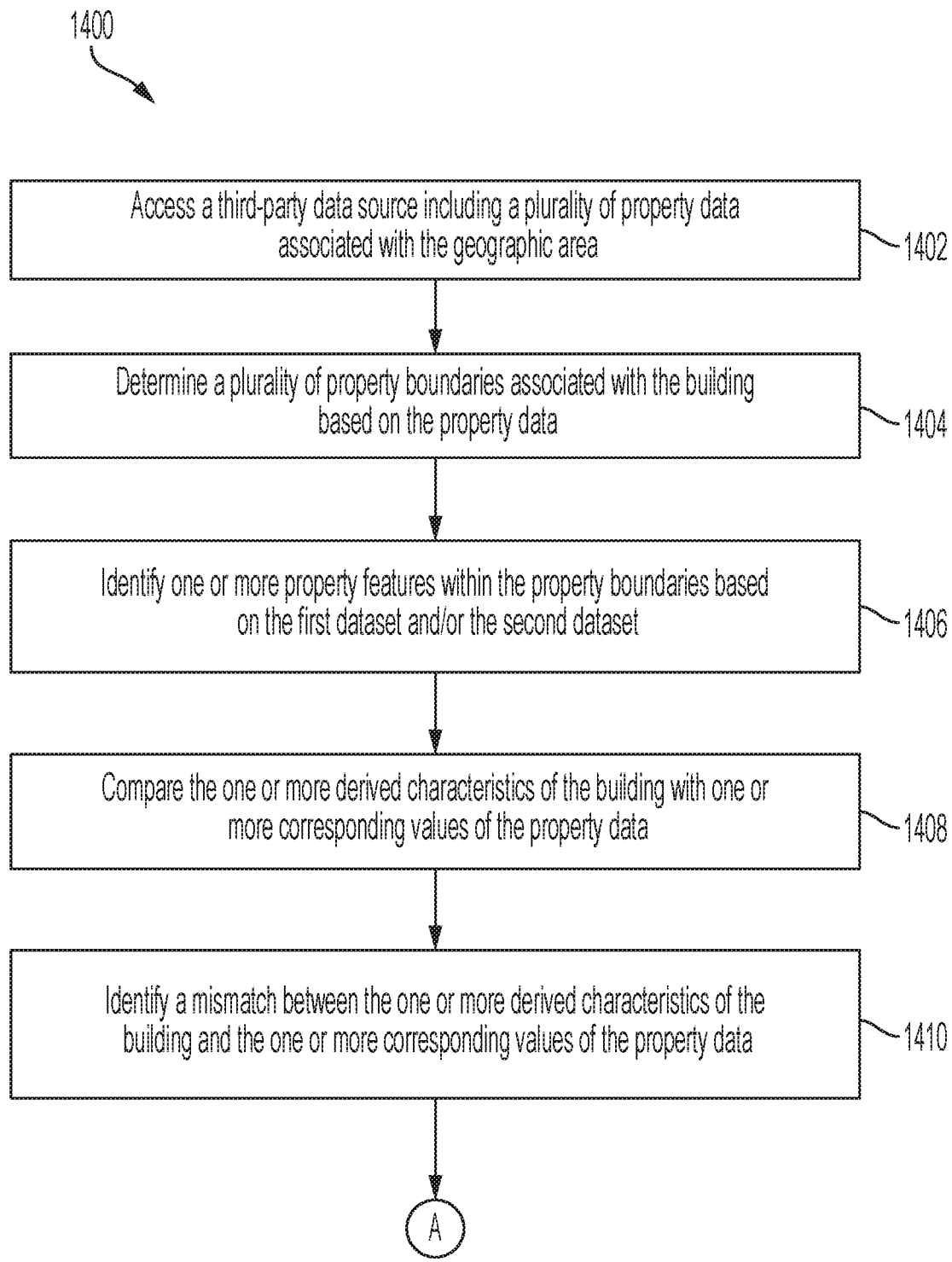
FIGS. 14A and 14B depict a process flow according to some embodiments of the present invention.
Figure 14B:
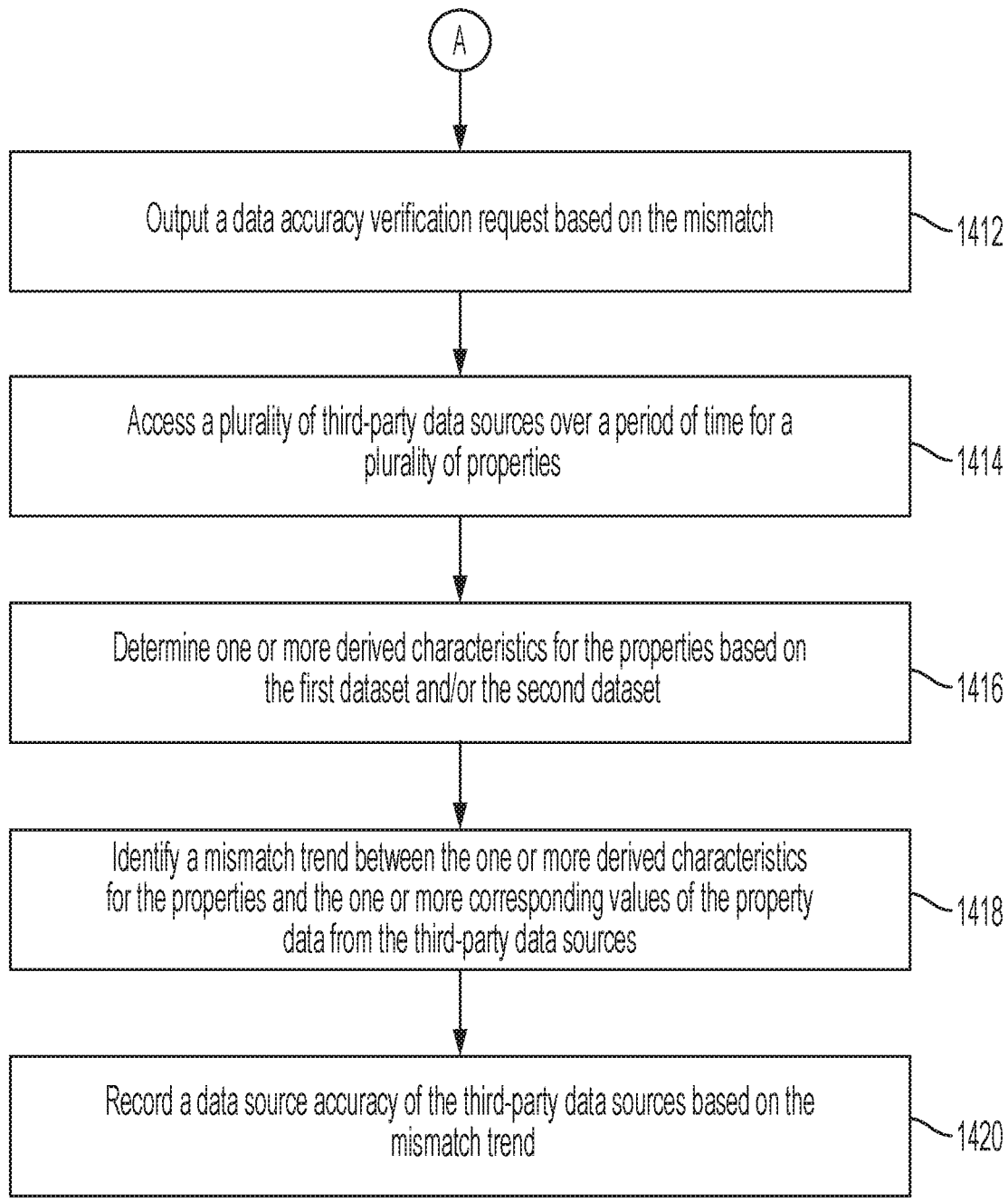

Process flow 1300 can be further enhanced to include one or more steps of process 1400 of FIGS. 14A and 14B. Although process 1400 is illustrated as a sequential flow, various steps of process 1400 can be selectively performed or omitted in embodiments. Further, steps of process 1400 can be incorporated within the process flow 1300 of FIGS. 13A and 13B or performed separately. At step 1402, the data processing server 102 can access a third-party data source, such as third-party services 118, that includes a plurality of property data 121 associated with the geographic area.

At step 1404, the data processing server 102 can determine a plurality of property boundaries associated with the building based on the property data 121. At step 1406, the data processing server 102 can identify one or more property features within the property boundaries based on the first dataset 318 and/or the second dataset 320. The one or more property features can include, for example, one or more of a deck, a shed, a pool, a patio, a garage, a playscape, a greenhouse, a fence, a driveway, an unknown structure, and/or a property hazard. The property boundaries can be defined as irregular polygons and can include partial boundaries when mapped to the geographic location covered by the first dataset 318 and/or second dataset 320. Coordinate transformations or other map adjustment techniques can be used to establish spatial alignment between the property boundaries and property features with respect to the first dataset 318 and/or second dataset 320.

At step 1408, the data processing server 102 can compare the one or more derived characteristics of the building with one or more corresponding values of the property data. At step 1410, the data processing server 102 can identify a mismatch between the one or more derived characteristics of the building and the one or more corresponding values of the property data. At step 1412, the data processing server 102 can output a data accuracy verification request based on the mismatch. At step 1414, the data processing server 102 can access a plurality of third-party data sources, such as third-party services 118, over a period of time for a plurality of properties.

At step 1416, the data processing server 102 can determine one or more derived characteristics for the properties based on the first dataset 318 and/or the second dataset 320. At step 1418, the data processing server 102 can identify a mismatch trend between the one or more derived characteristics for the properties and the one or more corresponding values of the property data from the third-party data sources. At step 1420, the data processing server 102 can record a data source accuracy of the third-party data sources based on the mismatch trend. The accuracy information can be used to identify whether third-party services 118 are accurately and consistently keeping associated data sources up to date. When the data source accuracy exceeds a threshold value, a request to refresh the data of the associated third-party service 118 can be triggered.

Technical effects include automated detection of features in image data that may not be readily observed and understood by a human observer without extensive additional analysis. Automated feature detection and construction of partial three-dimensional models can enable higher-level analysis functions to derive additional characteristics that may not be apparent in separate datasets.

It will be appreciated that aspects of the present invention may be embodied as a system, method, or computer program product and may take the form of a hardware embodiment, a software embodiment (including firmware, resident software, micro-code, etc.), or a combination thereof. Furthermore, aspects of the present invention may take the form of a computer program product embodied in one or more computer readable medium(s) having computer readable program code embodied thereon.

One or more computer readable medium(s) may be utilized. The computer readable medium may comprise a computer readable signal medium or a computer readable storage medium. A computer readable storage medium may comprise, for example, an electronic, magnetic, optical, electromagnetic, infrared, or semiconductor system, apparatus, or device, or any suitable combination of the foregoing. More specific examples (a non-exhaustive list) of the computer readable storage medium include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disk read-only memory (CD-ROM), an optical storage device, a magnetic storage device, or any suitable combination of the foregoing. In one aspect, the computer readable storage medium may comprise a tangible medium containing or storing a program for use by or in connection with an instruction execution system, apparatus, and/or device.

A computer readable signal medium may include a propagated data signal with computer readable program code embodied therein, for example, in baseband or as part of a carrier wave. Such a propagated signal may take any of a variety of forms, including, but not limited to, electromagnetic, optical, or any suitable combination thereof. A computer readable signal medium may comprise any computer readable medium that is not a computer readable storage medium and that can communicate, propagate, and/or transport a program for use by or in connection with an instruction execution system, apparatus, and/or device.

The computer readable medium may contain program code embodied thereon, which may be transmitted using any appropriate medium, including, but not limited to wireless, wireline, optical fiber cable, RF, etc., or any suitable combination of the foregoing. In addition, computer program code for carrying out operations for implementing aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer, or entirely on the remote computer or server.

It will be appreciated that aspects of the present invention are described herein with reference to flowchart illustrations and/or block diagrams of methods, apparatus (systems) and computer program products, according to embodiments of the invention. It will be understood that each block or step of the flowchart illustrations and/or block diagrams, and combinations of blocks or steps in the flowchart illustrations and/or block diagrams, can be implemented by computer program instructions. These computer program instructions may be provided to a processor of a computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks. The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

In addition, some embodiments described herein are associated with an "indication". As used herein, the term "indication" may be used to refer to any indicia and/or other information indicative of or associated with a subject, item, entity, and/or other object and/or idea. As used herein, the phrases "information indicative of" and "indicia" may be used to refer to any information that represents, describes, and/or is otherwise associated with a related entity, subject, or object. Indicia of information may include, for example, a code, a reference, a link, a signal, an identifier, and/or any combination thereof and/or any other informative representation associated with the information. In some embodiments, indicia of information (or indicative of the information) may be or include the information itself and/or any portion or component of the information. In some embodiments, an indication may include a request, a solicitation, a broadcast, and/or any other form of information gathering and/or dissemination.

Numerous embodiments are described in this patent application, and are presented for illustrative purposes only. The described embodiments are not, and are not intended to be, limiting in any sense. The presently disclosed invention(s) are widely applicable to numerous embodiments, as is readily apparent from the disclosure. One of ordinary skill in the art will recognize that the disclosed invention(s) may be practiced with various modifications and alterations, such as structural, logical, software, and electrical modifications. Although particular features of the disclosed invention(s) may be described with reference to one or more particular embodiments and/or drawings, it should be understood that such features are not limited to usage in the one or more particular embodiments or drawings with reference to which they are described, unless expressly specified otherwise.

Devices that are in communication with each other need not be in continuous communication with each other, unless expressly specified otherwise. On the contrary, such devices need only transmit to each other as necessary or desirable, and may actually refrain from exchanging data most of the time. For example, a machine in communication with another machine via the Internet may not transmit data to the other machine for weeks at a time. In addition, devices that are in communication with each other may communicate directly or indirectly through one or more intermediaries.

A description of an embodiment with several components or features does not imply that all or even any of such components and/or features are required. On the contrary, a variety of optional components are described to illustrate the wide variety of possible embodiments of the present invention(s). Unless otherwise specified explicitly, no component and/or feature is essential or required.

Further, although process steps, algorithms or the like may be described in a sequential order, such processes may be configured to work in different orders. In other words, any sequence or order of steps that may be explicitly described does not necessarily indicate a requirement that the steps be performed in that order. The steps of processes described herein may be performed in any order practical. Further, some steps may be performed simultaneously despite being described or implied as occurring non-simultaneously (e.g., because one step is described after the other step). Moreover, the illustration of a process by its depiction in a drawing does not imply that the illustrated process is exclusive of other variations and modifications thereto, does not imply that the illustrated process or any of its steps are necessary to the invention, and does not imply that the illustrated process is preferred.

"Determining" something can be performed in a variety of manners and therefore the term "determining" (and like terms) includes calculating, computing, deriving, looking up (e.g., in a table, database or data structure), ascertaining and the like.

It will be readily apparent that the various methods and algorithms described herein may be implemented by, e.g., appropriately and/or specially-programmed computers and/or computing devices. Typically a processor (e.g., one or more microprocessors) will receive instructions from a memory or like device, and execute those instructions, thereby performing one or more processes defined by those instructions. Further, programs that implement such methods and algorithms may be stored and transmitted using a variety of media (e.g., computer readable media) in a number of manners. In some embodiments, hard-wired circuitry or custom hardware may be used in place of, or in combination with, software instructions for implementation of the processes of various embodiments. Thus, embodiments are not limited to any specific combination of hardware and software.

A "processor" generally means any one or more microprocessors, CPU devices, computing devices, microcontrollers, digital signal processors, or like devices, as further described herein.

The term "computer-readable medium" refers to any medium that participates in providing data (e.g., instructions or other information) that may be read by a computer, a processor or a like device. Such a medium may take many forms, including but not limited to, non-volatile media, volatile media, and transmission media. Non-volatile media include, for example, optical or magnetic disks and other persistent memory. Volatile media include DRAM, which typically constitutes the main memory. Transmission media include coaxial cables, copper wire and fiber optics, including the wires that comprise a system bus coupled to the processor. Transmission media may include or convey acoustic waves, light waves and electromagnetic emissions, such as those generated during RF and IR data communications. Common forms of computer-readable media include, for example, a floppy disk, a flexible disk, hard disk, magnetic tape, any other magnetic medium, a CD-ROM, DVD, any other optical medium, punch cards, paper tape, any other physical medium with patterns of holes, a RAM, a PROM, an EPROM, a FLASH-EEPROM, any other memory chip or cartridge, a carrier wave, or any other medium from which a computer can read.

The term "computer-readable memory" may generally refer to a subset and/or class of computer-readable medium that does not include transmission media such as waveforms, carrier waves, electromagnetic emissions, etc. Computer-readable memory may typically include physical media upon which data (e.g., instructions or other information) are stored, such as optical or magnetic disks and other persistent memory, DRAM, a floppy disk, a flexible disk, hard disk, magnetic tape, any other magnetic medium, a CD-ROM, DVD, any other optical medium, punch cards, paper tape, any other physical medium with patterns of holes, a RAM, a PROM, an EPROM, a FLASH-EEPROM, any other memory chip or cartridge, computer hard drives, backup tapes, Universal Serial Bus (USB) memory devices, and the like.

Various forms of computer readable media may be involved in carrying data, including sequences of instructions, to a processor. For example, sequences of instruction (i) may be delivered from RAM to a processor, (ii) may be carried over a wireless transmission medium, and/or (iii) may be formatted according to numerous formats, standards or protocols, such as Bluetooth™, TDMA, CDMA, 3G.

Where databases are described, it will be understood by one of ordinary skill in the art that (i) alternative database structures to those described may be readily employed, and (ii) other memory structures besides databases may be readily employed. Any illustrations or descriptions of any sample databases presented herein are illustrative arrangements for stored representations of information. Any number of other arrangements may be employed besides those suggested by, e.g., tables illustrated in drawings or elsewhere. Similarly, any illustrated entries of the databases represent exemplary information only; one of ordinary skill in the art will understand that the number and content of the entries can be different from those described herein. Further, despite any depiction of the databases as tables, other formats (including relational databases, object-based models and/or distributed databases) could be used to store and manipulate the data types described herein. Likewise, object methods or behaviors of a database can be used to implement various processes, such as the described herein. In addition, the databases may, in a known manner, be stored locally or remotely from a device that accesses data in such a database.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one more other features, integers, steps, operations, element components, and/or groups thereof.

What is claimed is:

1. A system, comprising:
    a processing system; and
    a memory system in communication with the processing system, the memory system storing instructions that when executed by the processing system result in:
        applying a building detection model to identify a footprint of a building based on a first dataset;
        applying a building characterization model to identify one or more derived characteristics of the building based on the footprint;
        determining a building area based on the footprint and at least one of the one or more derived characteristics of the building;

creating a record comprising an indicator of a geographic area, the building area, and the one or more derived characteristics of the building;

generating a processing request based on the record;

accessing a third-party data source comprising a plurality of property data associated with the geographic area;

determining a plurality of property boundaries associated with the building based on the property data;

identifying one or more property features within the property boundaries based on the first dataset;

comparing the one or more derived characteristics of the building with one or more corresponding values of the property data;

identifying a mismatch between the one or more derived characteristics of the building and the one or more corresponding values of the property data; and outputting a data accuracy verification request based on the mismatch.

2. The system of claim 1, wherein the building detection model comprises an artificial intelligence model that predicts a roof location of the building based on individual pixel data and an aggregation of the individual pixel data.

3. The system of claim 1, further comprising instructions that when executed by the processing system result in:

accessing the first dataset comprising aerial imagery data associated with the geographic area from a first viewing perspective having a first visible light image layer and a first depth layer;

accessing a second dataset comprising aerial imagery data associated with the geographic area from a second viewing perspective having a second visible light image layer and a second depth layer; and merging the first visible light image layer and the first depth layer of the first dataset with the second visible light image layer and the second depth layer of the second dataset to construct a partial three-dimensional model of the building.

4. The system of claim 3, wherein the building characterization model identifies a number of floors of the building based on the partial three-dimensional model.

5. The system of claim 3, wherein the building characterization model identifies a roof overhang of the building based on the partial three-dimensional model.

6. The system of claim 3, wherein applying the building characterization model to identify one or more derived characteristics of the building is based on the footprint and the second dataset, and identifying one or more property features within the property boundaries is based on the first dataset and the second dataset.

7. The system of claim 6, wherein the one or more property features comprise one or more of a deck, a shed, a pool, a patio, a garage, a playscape, a greenhouse, a fence, a driveway, an unknown structure, and/or a property hazard.

8. The system of claim 6, wherein the aerial imagery data associated with the geographic area from the first viewing perspective and the second viewing perspective is aligned based on one or more grid patterns.

9. The system of claim 6, further comprising instructions that when executed by the processing system result in:

accessing a plurality of third-party data sources over a period of time for a plurality of properties;

determining one or more derived characteristics for the properties based on the first dataset and the second dataset;

identifying a mismatch trend between the one or more derived characteristics for the properties and the one or more corresponding values of the property data from the third-party data sources; and recording a data source accuracy of the third-party data sources based on the mismatch trend.

10. The system of claim 1, wherein the one or more derived characteristics of the building comprise a roofing material, a roof shape, a siding material, a solar panel presence, a window count, a window size, a skylight presence, and a chimney condition.

11. The system of claim 1, further comprising instructions that when executed by the processing system result in:

providing an interactive interface through a graphical user interface;

highlighting the footprint on the graphical user interface; and generating a visual indicator on the graphical user interface based on the one or more derived characteristics of the building.

12. The system of claim 11, further comprising instructions that when executed by the processing system result in:

identifying the geographic area based on a user input at the graphical user interface.

13. The system of claim 1, further comprising instructions that when executed by the processing system result in:

performing batch processing for a plurality of properties to create a plurality of records and generate a sequence of processing requests based on the records.

14. The system of claim 1, wherein the processing request comprises population of one or more electronic forms in a second system based on the record.

15. The system of claim 1, wherein the processing request comprises a scoring computation based on comparing contents of the record to one or more scoring thresholds, forwarding a result of the scoring computation with the record for a quote, and sending the quote to a user identifier associated with the property.

16. The system of claim 1, further comprising instructions that when executed by the processing system result in:

training the building detection model and the building characterization model based on a plurality of training sets comprising a plurality of property images labeled by pixel boundaries.

17. The system of claim 16, wherein either or both of the building detection model and the building characterization model are partially retrained models based on one or more previously trained models.

18. A computer program product comprising a non-transitory storage medium embodied with computer program instructions that when executed by a computer cause the computer to implement:

applying a building detection model to identify a footprint of a building based on a first dataset;

applying a building characterization model to identify one or more derived characteristics of the building based on the footprint;

determining a building area based on the footprint and at least one of the one or more derived characteristics of the building;

creating a record comprising an indicator of a geographic area, the building area, and the one or more derived characteristics of the building;

generating a processing request based on the record;

accessing a third-party data source comprising a plurality of property data associated with the geographic area;

determining a plurality of property boundaries associated with the building based on the property data;

identifying one or more property features within the property boundaries based on the first dataset;

comparing the one or more derived characteristics of the building with one or more corresponding values of the property data;

identifying a mismatch between the one or more derived characteristics of the building and the one or more corresponding values of the property data; and outputting a data accuracy verification request based on the mismatch.

19. The computer program product of claim 18, wherein the building detection model comprises an artificial intelligence model that predicts a roof location of the building based on individual pixel data and an aggregation of the individual pixel data.

20. The computer program product of claim 18, further comprising computer program instructions that when executed by the computer cause the computer to implement:

accessing the first dataset comprising aerial imagery data associated with the geographic area from a first viewing perspective having a first visible light image layer and a first depth layer;

accessing a second dataset comprising aerial imagery data associated with the geographic area from a second viewing perspective having a second visible light image layer and a second depth layer; and merging the first visible light image layer and the first depth layer of the first dataset with the second visible light image layer and the second depth layer of the second dataset to construct a partial three-dimensional model of the building, wherein the building characterization model identifies one or more of: a number of floors of the building based on the partial three-dimensional model and a roof overhang of the building based on the partial three-dimensional model.

21. The computer program product of claim 20, wherein applying the building characterization model to identify one or more derived characteristics of the building is based on the footprint and the second dataset, and identifying one or more property features within the property boundaries is based on the first dataset and the second dataset.

22. The computer program product of claim 21, further comprising computer program instructions that when executed by the computer cause the computer to implement:

accessing a plurality of third-party data sources over a period of time for a plurality of properties;

determining one or more derived characteristics for the properties based on the first dataset and the second dataset;

identifying a mismatch trend between the one or more derived characteristics for the properties and the one or more corresponding values of the property data from the third-party data sources; and recording a data source accuracy of the third-party data sources based on the mismatch trend.

23. The computer program product of claim 20, wherein the aerial imagery data associated with the geographic area from the first viewing perspective and the second viewing perspective is aligned based on one or more grid patterns.

24. The computer program product of claim 18, further comprising computer program instructions that when executed by the computer cause the computer to implement:

providing an interactive interface through a graphical user interface;

highlighting the footprint on the graphical user interface; and generating a visual indicator on the graphical user interface based on the one or more derived characteristics of the building.

25. The computer program product of claim 18, further comprising computer program instructions that when executed by the computer cause the computer to implement:

performing batch processing for a plurality of properties to create a plurality of records and generate a sequence of processing requests based on the records.

26. The computer program product of claim 18, further comprising computer program instructions that when executed by the computer cause the computer to implement:

training the building detection model and the building characterization model based on a plurality of training sets comprising a plurality of property images labeled by pixel boundaries.

* * * * *